United States Patent
Hudgens et al.

(10) Patent No.: US 12,106,991 B2
(45) Date of Patent: Oct. 1, 2024

(54) SUBSTRATE TRANSFER SYSTEMS AND METHODS OF USE THEREOF

(71) Applicant: Applied Materials, Inc., Santa Clara, CA (US)

(72) Inventors: Jeffrey C. Hudgens, San Francisco, CA (US); Ulrich Oldendorf, Darmstadt (DE)

(73) Assignee: Applied Materials, Inc., Santa Clara, CA (US)

( * ) Notice: Subject to any disclaimer, the term of this patent is extended or adjusted under 35 U.S.C. 154(b) by 86 days.

(21) Appl. No.: 17/949,090

(22) Filed: Sep. 20, 2022

(65) Prior Publication Data

US 2023/0085667 A1 Mar. 23, 2023

Related U.S. Application Data

(60) Provisional application No. 63/247,073, filed on Sep. 22, 2021.

(51) Int. Cl.
*H01L 21/677* (2006.01)
*B65G 54/02* (2006.01)
*H01L 21/67* (2006.01)

(52) U.S. Cl.
CPC ........ *H01L 21/67709* (2013.01); *B65G 54/02* (2013.01); *H01L 21/67201* (2013.01); *H01L 21/67706* (2013.01)

(58) Field of Classification Search
CPC ......... H01L 21/67709; H01L 21/67201; H01L 21/67706; H01L 21/67196;

(Continued)

(56) References Cited

U.S. PATENT DOCUMENTS

| 4,805,761 A | 2/1989 | Totsch |
| 5,641,054 A * | 6/1997 | Mori ................ H01L 21/67184 |
| | | 198/465.1 |

(Continued)

FOREIGN PATENT DOCUMENTS

| EP | 0648698 A1 | 4/1995 |
| EP | 3016136 A1 | 5/2016 |

(Continued)

OTHER PUBLICATIONS

International Search Report and Written Opinion mailed on Jul. 12, 2021, on application No. PCT/US2021/23327.

(Continued)

*Primary Examiner* — Gene O Crawford
*Assistant Examiner* — Muhammad Awais
(74) *Attorney, Agent, or Firm* — Lowenstein Sandler LLP

(57) ABSTRACT

Disclosed herein are systems and methods relating to a transfer chamber for an electronic device processing system. The transfer chamber includes a magnetic levitation platform, having a magnetic levitation track disposed along a length of the transfer chamber and configured to generate a magnetic field above the track. The transfer chamber also includes a magnetic levitation track disposed along a width of the transfer chamber such that a plane of this lateral track crosses a plane of the longitudinal track at a junction. The lateral track is configured to generate a magnetic field above or below the track. The platform further includes at least one substrate carrier configured to move along the longitudinal track and the lateral track. The substrate carrier also is configured to rotate at the junction.

21 Claims, 12 Drawing Sheets

(58) Field of Classification Search
CPC ......... H01L 21/67748; H01L 21/68742; H01L 21/67742; B65G 54/02; B60L 13/04; B60L 13/10
USPC ........................................................ 198/619
See application file for complete search history.

(56) References Cited

U.S. PATENT DOCUMENTS

| | | | |
|---|---|---|---|
| 6,394,733 | B1 | 5/2002 | Toda et al. |
| 7,527,141 | B2 | 5/2009 | Rice et al. |
| 8,197,177 | B2 | 6/2012 | van Der Meulen |
| 8,851,817 | B2 | 10/2014 | Bonora et al. |
| 10,056,279 | B2 | 8/2018 | Janakiraman et al. |
| 11,527,424 | B2 | 12/2022 | Berger et al. |
| 11,784,074 | B2 | 10/2023 | Berger et al. |
| 2006/0285945 | A1* | 12/2006 | Hofmeister ....... H01L 21/67742 414/217 |
| 2011/0038692 | A1 | 2/2011 | Hofmeister et al. |
| 2012/0213614 | A1* | 8/2012 | Bonora ............. H01L 21/67778 414/217 |
| 2015/0122180 | A1 | 5/2015 | Chang et al. |
| 2016/0114989 | A1 | 4/2016 | Hibbs et al. |
| 2020/0027767 | A1* | 1/2020 | Zang ........................ C23C 14/50 |
| 2020/0111692 | A1* | 4/2020 | Newman ........ H01L 21/67733 |
| 2020/0190660 | A1* | 6/2020 | Ogawa .................... C23C 14/042 |
| 2020/0232088 | A1* | 7/2020 | White .................. C23C 14/3407 |
| 2021/0043471 | A1* | 2/2021 | Nakata ............. H01L 21/02101 |
| 2021/0249291 | A1* | 8/2021 | Raatz ................ H01L 21/67724 |
| 2021/0265188 | A1* | 8/2021 | Moura .............. H01L 21/67715 |

FOREIGN PATENT DOCUMENTS

| | | | |
|---|---|---|---|
| JP | 07115120 A | | 5/1995 |
| KR | 20120058478 A | | 6/2012 |
| KR | 101386685 B1 | * | 4/2014 |
| WO | WO-2018135792 A1 | * | 7/2018 ........ H01L 21/67184 |
| WO | WO-2019081043 A1 | * | 5/2019 ............ B65G 49/06 |
| WO | WO-2020180334 A1 | * | 9/2020 |
| WO | 2020207578 A1 | | 10/2020 |

OTHER PUBLICATIONS

International Search Report and Written Opinion for International Application No. PCT/US2022/044278, mailed Jan. 12, 2023, 10 Pages.

* cited by examiner

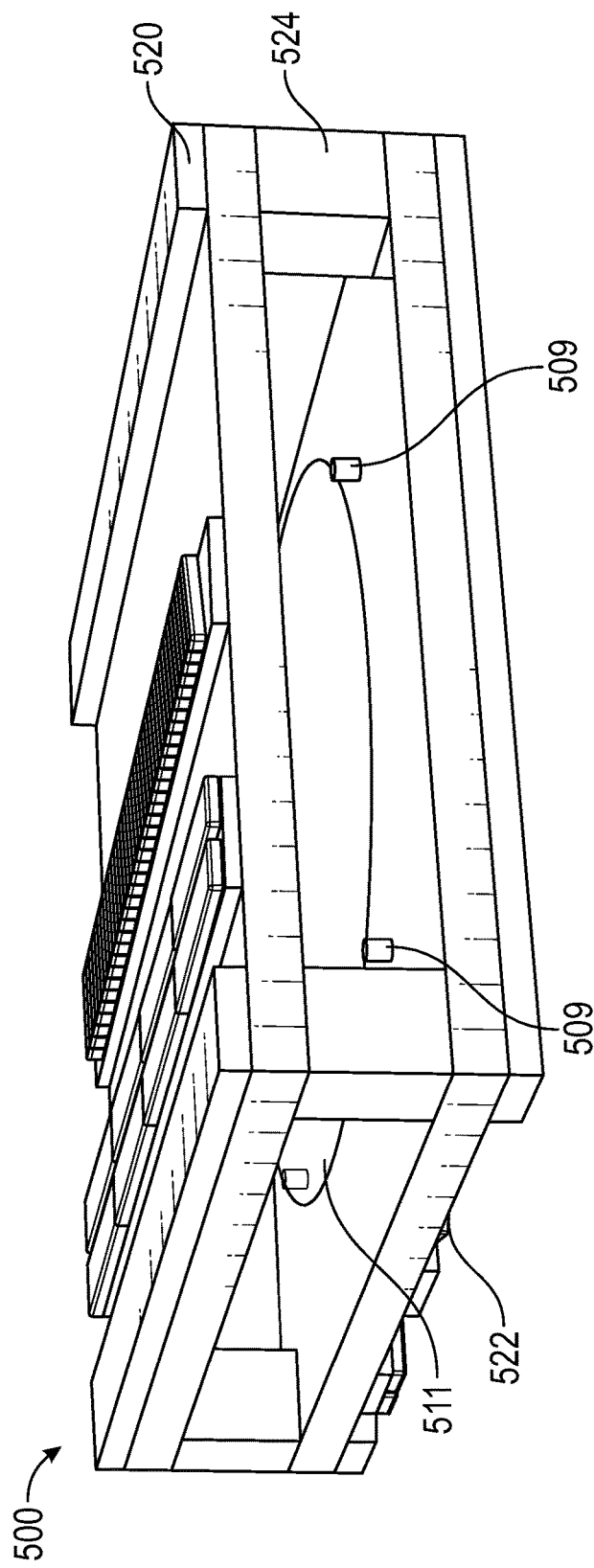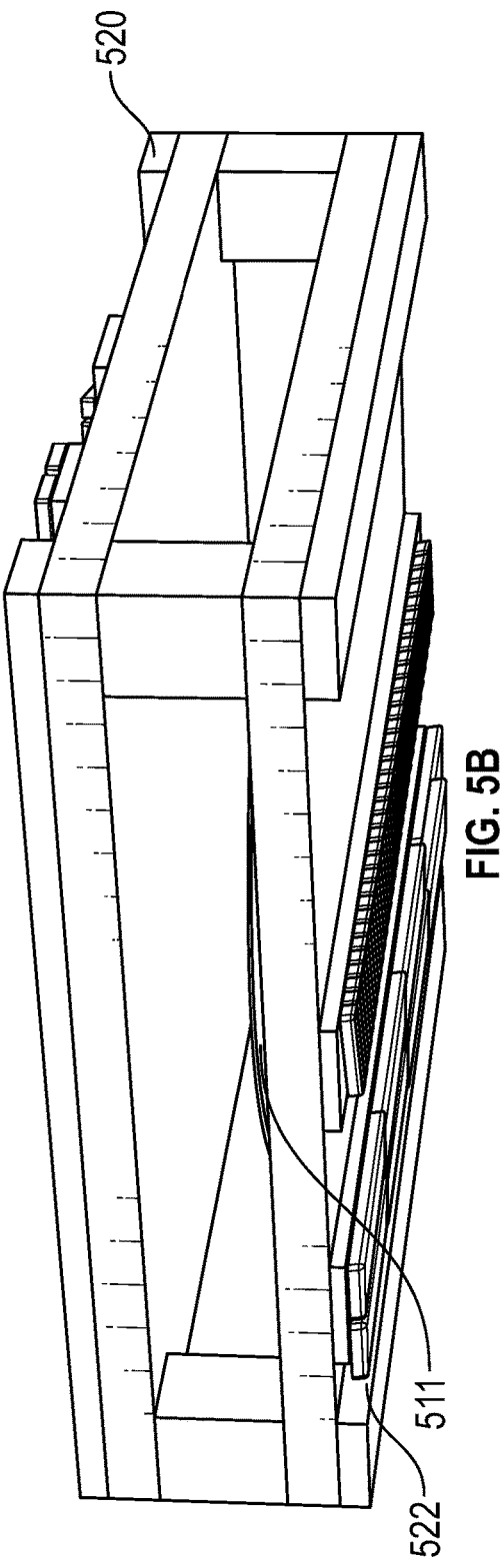
FIG. 5A
FIG. 5B

Substrate Transfer Systems and Methods of Use Thereof

RELATED APPLICATIONS

The present application claims the benefit under 35 U.S.C. § 119(e) of U.S. Provisional Patent Application No. 63/247,073 filed Sep. 22, 2021, which is incorporated by reference herein.

FIELD

The disclosure relates generally to the field of robotics. In particular, the disclosure relates to substrate transfer systems, which transport substrates between process chambers within an isolated environment. The substrates may be transported using a magnetic levitation platform within a transport enclosure. Also disclosed are methods of using such magnetic levitation platforms within a transfer chamber.

BACKGROUND

Semiconductor devices are formed on substrates through numerous process steps within one or more process chambers of a semiconductor manufacturing system. Each process chamber completes one or more of the various steps (e.g., etching, polishing, deposition, etc.) to form the semiconductor devices. The process chambers are held under vacuum. Substrate transfer systems, which are also held under vacuum, can interconnect process chambers and move the substrates between the process chambers without having to break vacuum. Some substrate transfer systems have a linear and rectangular arrangement such that process chambers are positioned along each side of the transfer chamber.

A substrate transfer system using a linear arrangement typically includes a conveyor having a rectangular top surface with the process chambers on one side or opposite sides of the conveyor. The conveyor can be connected to one or more load lock in order to maintain the vacuum environment within the transfer system. Substrates are placed in and removed from the load lock, which will only open to the transfer chamber once under vacuum. One or more robots may be positioned near the process chambers and load lock to transfer the substrates between the conveyor and the process chambers or load lock.

Conventional substrate carriers are typically limited to moving substrates in only one direction. Options for moving substrates between process chambers and to or from a load lock are limited. Additionally, conventional substrate carriers can have a large footprint and internal volume to accommodate the conveyors.

BRIEF SUMMARY

According to one or more embodiments, disclosed herein is a transfer chamber for an electronic device processing system, comprising: a magnetic levitation platform, comprising: a first magnetic levitation track disposed along a length of the transfer chamber and configured to generate a first magnetic field above the first magnetic levitation track; a second magnetic levitation track disposed along a width of the transfer chamber, wherein a plane of the second magnetic levitation track crosses a plane of the first magnetic levitation track at a first junction, wherein the second magnetic levitation track is configured to generate a second magnetic field above or below the second magnetic levitation track; and at least one substrate carrier configured to move along the first magnetic levitation track and the second magnetic levitation track, wherein the substrate carrier is configured to rotate at the first junction.

Further disclosed herein in one or more embodiments is a transfer chamber for an electronic device processing system, comprising: a magnetic levitation platform, comprising: a first magnetic levitation track disposed along a length of the transfer chamber at a first height within the transfer chamber and configured to generate a first magnetic field above the first magnetic levitation track; a second magnetic levitation track disposed along a width of the transfer chamber at a second height within the transfer chamber, wherein the second magnetic levitation track is configured to generate a second magnetic field below the second magnetic levitation track; and at least one substrate carrier configured to move along the first magnetic levitation track and the second magnetic levitation track, wherein the substrate carrier is configured to move from the first magnetic levitation track to the second magnetic levitation track at a point of intersection between a plane of the first magnetic levitation track and a plane of the second magnetic levitation track.

In yet further embodiments, disclosed herein is a method of moving one or more substrates in a transfer chamber, comprising: retrieving from a first process chamber a first substrate by a first substrate carrier engaged with a first magnetic levitation track disposed along a length of the transfer chamber, wherein the first magnetic levitation track is configured to generate a first magnetic field above the first magnetic levitation track; generating the first magnetic field by the first magnetic levitation track to move the first substrate carrier with the first substrate in a first direction along the first magnetic levitation track; rotating the first substrate carrier with the first substrate at a first junction formed where a plane of a second magnetic levitation track crosses a plane of the first magnetic levitation track, wherein the second magnetic levitation track is disposed along a width of the transfer chamber and is configured to generate a second magnetic field above or below the second magnetic levitation track; generating the second magnetic field by the second magnetic levitation track to move the first substrate carrier with the first substrate in a second direction along the second magnetic levitation track; rotating the first substrate carrier with first substrate at a second junction formed where a plane of a third magnetic levitation track crosses the plane of the second magnetic levitation track, wherein the third magnetic levitation track is disposed along the length of the transfer chamber spaced apart from the first magnetic levitation track and is configured to generate a third magnetic field above the third magnetic levitation track; generating the third magnetic field by the third magnetic levitation track to move the first substrate carrier with the first substrate in a third direction along the third magnetic levitation track to a second process chamber positioned on an opposite side of the transfer chamber from the first process chamber; and rotating the first substrate carrier with the first substrate and placing the first substrate in the second process chamber.

BRIEF DESCRIPTION OF THE DRAWINGS

The present disclosure is illustrated by way of example, and not by way of limitation, in the figures of the accompanying drawings in which like references indicate similar elements.

FIG. 5A depicts an embodiment of a substrate carrier for use with magnetic levitation platforms according to various embodiments.

FIG. 5B depicts an embodiment of a substrate carrier for use with magnetic levitation platforms according to various embodiments.

DETAILED DESCRIPTION

Figure 1A:
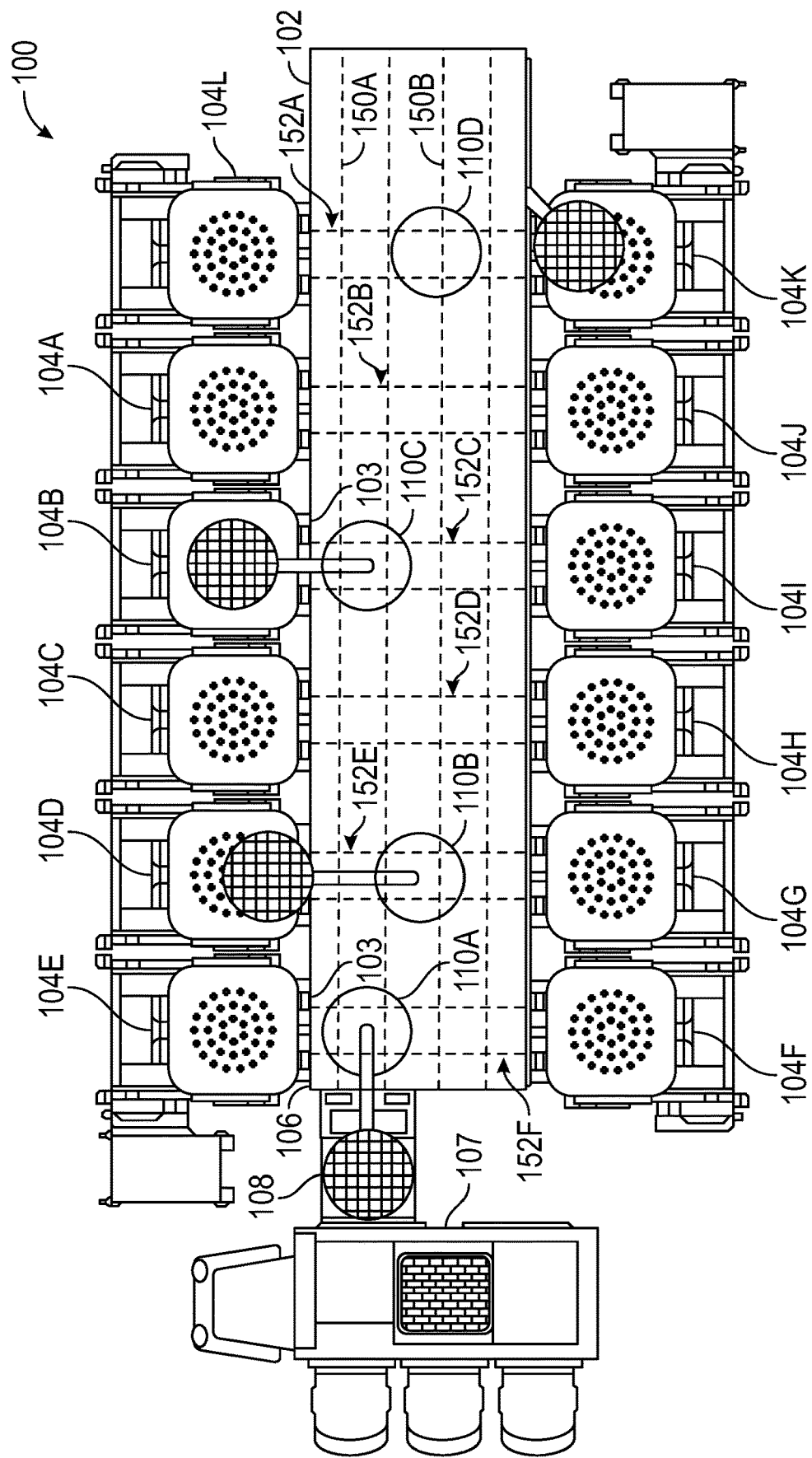
FIG. 1A depicts a top view of a substrate transfer system according to various embodiments.

According to embodiments, disclosed herein is a transfer chamber having a magnetic levitation platform (also referred to herein as a magnetic levitation system) for use in a semiconductor manufacturing system. A transfer chamber having a magnetic levitation platform according to embodiments herein can have a smaller footprint than conventional conveyor systems, provides a flexible substrate flow, can have a smaller vacuum volume than convention transfer systems and is relatively easy to service.

In embodiments, the magnetic levitation platform includes a network of magnetic levitation tracks (also referred to herein as "lanes") that can move substrates from one position to another within a chamber without breaking vacuum. The magnetic levitation platform can provide random access to process chambers and load locks connected to, e.g., a transfer chamber in which the magnetic levitation platform is located. In some embodiments, the magnetic levitation platform may include one or more longitudinal magnetic levitation track that runs along the length of a chamber and one or more lateral magnetic levitation track that runs along the width of the chamber. In one or more embodiments, the magnetic levitation platform may include two (2) to five (5) longitudinal tracks in a spaced-apart configuration and two (2) to five (5) lateral tracks, also in a spaced apart configuration. The lateral tracks may run at an angle (e.g., at about 90°) with respect to the longitudinal tracks such that a plane of each lateral track intersects a plane of each longitudinal track at one or more junctions. At least one substrate carrier may be configured to move linearly along a longitudinal track or a lateral track. At a junction, the at least one substrate carrier may be configured to switch from a longitudinal track to a lateral track, or vice versa, and change direction. The at least one substrate carrier may be configured to rotate at the junctions. For example, the at least one substrate carrier may be configured to rotate about ±90° to about ±180° at one or more junction. With or without a rotation of, e.g., ±90°, the substrate and carrier may move from one longitudinal track to a parallel longitudinal track via a lateral track. The substrate and carrier may be rotated by ±180° at a junction in some embodiments. After such rotation, the substrate carrier may move along the same longitudinal track, but in an opposite direction.

In one or more embodiments, the one or more longitudinal tracks may be at a different height than the one or more lateral tracks. In at least one embodiment, the one or more lateral track may be configured to align with a process chamber inlet whereas the longitudinal tracks may be configured to span the length of the transfer chamber, for example, one or more of the longitudinal tracks aligns with one or more load lock positioned at an end of the transfer chamber. At a junction, where the plane of a longitudinal track crosses the plane of a lateral track, the substrate carrier may be configured to move vertically from the longitudinal track to the lateral track, or vice versa. The vertical motion may be performed in addition to or instead of a rotation. In at least one embodiment, the one or more longitudinal tracks are in a face up orientation on a bottom surface of the chamber and the one or more lateral tracks are in a face down orientation on a top surface of the chamber. In at least one embodiment, the one or more longitudinal tracks are on the top surface of the chamber in a face down orientation and the one or more lateral tracks are on a bottom surface of the chamber in a face up orientation. The at least one substrate carrier may include a magnet (e.g., a mover) on a top surface to engage with the one or more top tracks and another magnet (e.g., a mover) on a bottom surface to engage with the one or more bottom tracks.

According to one or more embodiments, the substrate carrier may be about 300-320 mm in width and about 300-320 mm in length. The longitudinal tracks and lateral tracks may be spaced apart by at least a suitable distance so that two substrate carriers with substrates thereon moving on adjacent longitudinal tracks or adjacent lateral tracks do not collide. In some embodiments, the longitudinal tracks may be spaced apart by about 350 mm to about 450 mm or any individual value or sub-range within this range. In some embodiments, the lateral tracks may be spaced apart by about 900 mm to about 1000 mm, or any individual value or sub-range within this range including about 914 mm.

In at least one embodiment, the bottom surface of the transfer chamber provides a motive force. The motive force may be generated by at least one stator of at least one linear motor. Substrate carriers that are used to transport substrates within the transfer chamber may include magnets (e.g., movers), which enable the substrate carriers to be moved by the at least one linear motor along the one or more longitudinal and/or lateral tracks.

Figure 1B:
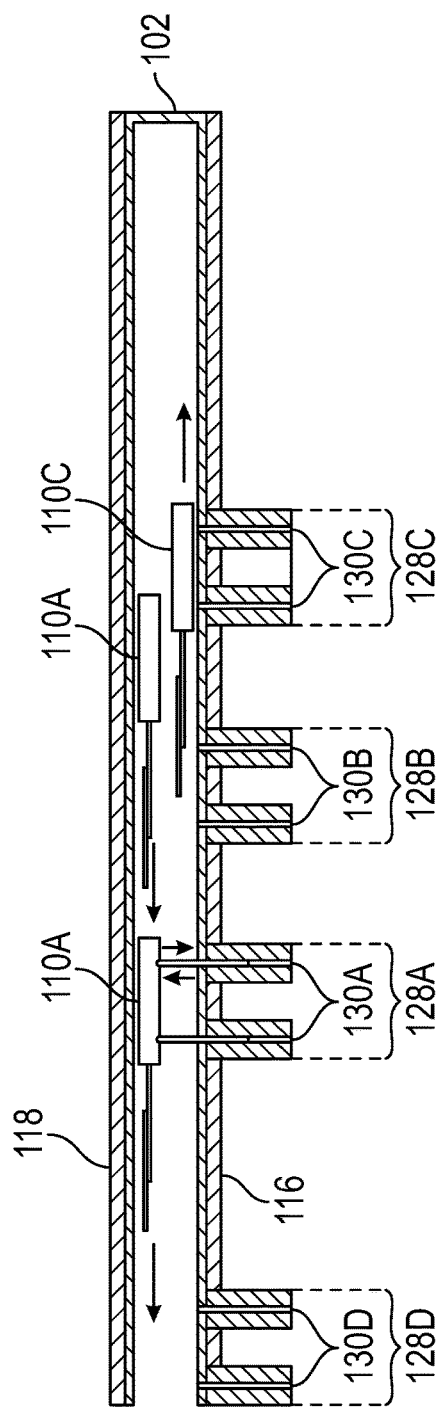
FIG. 1B depicts a longitudinal side view of a substrate transfer system according to various embodiments.
Figure 1C:
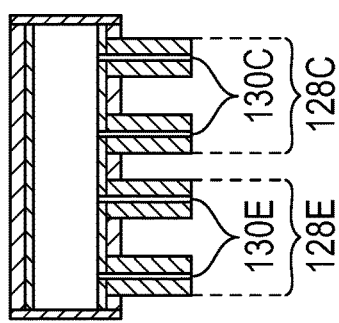
FIG. 1C depicts a lateral side view of a substrate transfer system according to various embodiments.

FIGS. 1A-C illustrate one embodiment of a substrate transfer system. FIG. 1A depicts a top view of a substrate transfer system according to various embodiments. FIG. 1B depicts a longitudinal side view of a substrate transfer system according to various embodiments. FIG. 1C depicts a lateral side view of a substrate transfer system according to various embodiments.

Referring to FIGS. 1A-C, a transfer chamber 102, for an electronic device processing system 100, can have at least one port 103 configured to permit access to at least one process chamber 104A-L. In embodiments, the transfer chamber 102 can have a plurality of ports 103, where each of the ports is configured to permit access to one of a plurality of process chambers 104A-L. Each port may include a slit valve that is sized to receive an end effector holding a substrate (e.g., a wafer). In one embodiment, all of the ports 103 and/or slit valves are co-planar and share a common height. Alternatively, different ports and/or slit valves may be positioned at different heights and/or planes. Additionally, in one embodiment, all ports 103 and/or slit valves have a common opening pitch (vertical dimension of the opening). The common opening pitch may be a single-height pitch that can receive an end effector and substrate positioned at a specific height or a multi-height pitch that can receive end effectors and substrates positioned at multiple different heights (e.g., end effectors and substrates of substrate carriers attached to a bottom track as well as end effectors and substrates of substrate carriers attached to a top track). Alternatively, different ports 103 may have different opening pitches.

According to embodiments, the transfer chamber can have a length and a width, where a first dimension (referred to as a longitudinal direction) of the length is orders of magnitude greater than a second dimension (referred to as a lateral direction) of the width. The plurality of ports 103 can be disposed along the length of the transfer chamber 102. In embodiments, the ports 103 may be oriented approximately orthogonal to the length of the transfer chamber 102. In embodiments, the length is about 5 ft to about 20 ft, or about 6 ft, or about 8 ft, or about 10 ft, or about 12 ft, or about 14 ft, or about 16 ft, or about 18 ft, or about 20 ft, and so on. In embodiments, the transfer chamber 102 can further include an additional port 106 configured to permit access to a load lock 107 (or multiple additional ports each configured to permit access to one or more load locks). The additional port 106 can be disposed at a first end of the transfer chamber 102 along the width of the transfer chamber 102. The load lock 107 may be connected to a factory interface 109 containing one or more front opening unified pods (FOUPs) 111. Additionally, one or more further ports (not shown) may be positioned at an opposite end of the transfer chamber from port 106, and may be configured to permit access to one or more load locks and/or process chambers. The factory interface contains a robot (not shown) that takes wafers from the FOUPs 111 and places them in the load lock 107 for the substrate carriers 110, 110A-C to retrieve them from the load lock 107.

In some embodiments, the port 106 may be approximately orthogonal to ports 103. In embodiments, the width of the transfer chamber 100 is approximately equal to two times the width of the load lock 107 or two times the width of a substrate 108, 108A-108C. In embodiments, the width of the transfer chamber 100 is approximately equal to three times the width of the load lock 107 or three times the width of a substrate 108, 108A-108C.

The transfer chamber system 100 includes at least one substrate carrier 110A-110D configured to transfer a substrate 108 between the at least one process chamber 104A-104L and the transfer chamber 102. According to embodiments, the transfer chamber 102 can contain several substrate carriers 110A-110D, for example, 2, 3, 4, 5, 6, 7, 8, 9 or 10, or about 2 to about 10 substrate carriers.

Each substrate carrier 110A-110D is configured to move using a magnetic levitation conveyor system (e.g., one or more linear motors). For example, each substrate carrier 110A-110C can move along at least one magnetic levitation track 150A-B, 152A-F. According to embodiments, the transfer chamber 102 can include two (or more) longitudinal magnetic levitation tracks 150A, 150B and multiple lateral magnetic levitation tracks 152A, 152B, 152C, 152D, 152E, 152F. Each magnetic levitation track may include a respective stator of a linear motor. In one embodiment, longitudinal magnetic levitation tracks are positioned on a bottom interior surface 116 of the transfer chamber 102 and lateral magnetic levitation tracks 152A-F are positioned on an opposite, top interior surface 118 of the transfer chamber 102. The longitudinal magnetic levitation tracks 150A-B can be configured to move substrate carriers 110A-C in a forward and backward direction (away from and towards the load lock) while the lateral magnetic levitation tracks 152A-F can be configured to move substrate carriers towards and away from processing chambers connected to the length of the transfer chamber 102 (e.g., perpendicular to the longitudinal axis of the transfer chamber.

In embodiments, the longitudinal magnetic levitation tracks 150A-B are positioned at the top of the transfer chamber, and lateral magnetic levitation tracks 152A-F are positioned at the bottom of the transfer chamber. In embodiments, longitudinal magnetic levitation tracks 150A-B may be positioned at the top and/or bottom of the transfer chamber, and lateral magnetic levitation tracks can also be positioned at that top and/or bottom of the transfer chamber. Magnetic levitation tracks can be in a facing arrangement (e.g., with any magnetic levitation track(s) on the bottom of the transfer chamber in a face-up orientation and any magnetic levitation tracks on the top of the transfer chamber in a face-down orientation) as shown in FIG. 1B. In embodiments, the upper tracks and the lower tracks may be spaced apart by a distance of about 40 mm to about 300 mm, or about 100 mm to about 250 mm, or about 150 mm to about 200 mm.

According to embodiments, the longitudinal magnetic levitation tracks 150A-B can be configured to move one or more of a plurality of substrate carriers 110A-110D along the length (e.g., along a longitudinal axis) of the transfer chamber 102. The lateral magnetic levitation tracks 152A-F can be configured to move one or more of the plurality of substrate carriers 110A-110D along a lateral axis that is orthogonal to the longitudinal axis of the transfer chamber 102. In one embodiment, longitudinal magnetic levitation track 150A moves substrate carriers 110A-D in a first direction (e.g., away from the load lock) and longitudinal magnetic levitation track 150B moves substrate carriers 110A-D in an opposite second direction (e.g., toward the load lock). Substrate carriers may be transferred between the longitudinal magnetic levitation tracks 150A-B via lateral magnetic levitation tracks 152A-F.

In some embodiments, as shown, the width of the transfer chamber 102 is too narrow to enable a substrate carrier positioned proximate to a process chamber to rotate in a manner that causes a held substrate to be directed towards that process chamber. In such embodiments, in order to place a substrate into a process chamber (e.g., process chamber 104D) a substrate carrier (e.g., substrate carrier 110B) is positioned at an intersection of a lateral track and a longitudinal track on an opposite side of the transfer chamber to the process chamber into which the substrate will be placed. The substrate carrier may then rotate towards the process chamber until it is approximately lined up with the lateral track (and perpendicular to the longitudinal track). The substrate carrier may then move along the lateral track towards the process chamber to place the substrate into the process chamber. After placement of the substrate in the process chamber, the substrate carrier may move in the opposite direction until it is again at the intersection of a lateral track and a longitudinal track opposite the process chamber, and may then rotate so that it faces in the longitudinal direction.

Figure 1D:
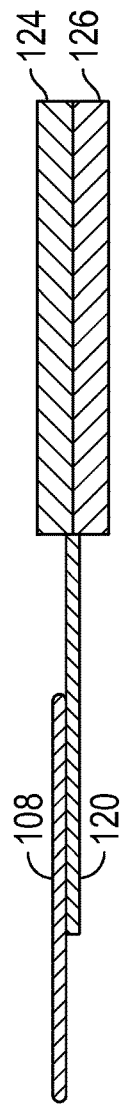
FIG. 1D depicts a substrate carrier according to various embodiments.

FIG. 1D shows an embodiment of a substrate carrier 110 suitable for use in the transfer chamber system 100 according to embodiments. The substrate carrier 110 can include an end effector 120 for receiving, lifting and holding a substrate 108, such as a wafer, and/or on which a substrate may be placed. Any suitable end effector 120 for use in a semiconductor processing system can be used as would be understood by those of ordinary skill in the art. According to embodiments, the one or more substrate carrier 110 can be a robot arm as known to those of ordinary skill in the art. The substrate carrier 110 can include an upper magnetic portion 124 and a lower magnetic portion 126. The lower magnetic portion 126 may be, for example, a first mover of a first linear motor. The upper magnetic portion 124 may be, for example, a second mover of a second linear motor. Alternatively, the upper magnetic portion and the lower magnetic portion may be upper and lower halves of a single mover that is configured to engage with a first stator below the substrate carrier 110 and a second stator above the substrate carrier 110. The upper magnetic portion 124 may include one or more magnets (e.g., permanent magnets), and the lower magnetic portion 126 may include one or more additional magnets. The upper and lower magnetic portions may be configured such that their magnetic fields do not interfere with one another. The magnetic levitation conveyor system includes one or more electromagnets (not shown) for controlling movement of the substrate carriers and linear motors (not shown) for moving the substrate carriers 110, 110A-110D.

Referring back to FIGS. 1A-1C, according to embodiments, the plurality of ports 103, can be or include a plurality of slit valves. A first transfer plane of at least a first subset of the plurality of slit valves is accessible to the substrate carriers engaged with the magnetic levitation tracks disposed on the bottom surface of the transfer chamber. A second transfer plane of a second subset of the plurality of slit valves can be accessible to substrate carriers engaged with the magnetic levitation tracks disposed on the top surface of the transfer chamber. To further improve throughput and enable approximately simultaneous swapping of substrates in a process chamber 104A-L or load lock 107, at least some of the plurality of slit valves have a first wafer transfer plane and a second wafer transfer plane that is above the first wafer transfer plane. The first wafer transfer plane can be accessible to substrate carriers that are engaged with the magnetic levitation tracks on the bottom surface. The second wafer transfer plane can be accessible to substrate carriers that are engaged with magnetic levitation tracks on the top surface. In further embodiments, the plurality of slit valves can have a common transfer plane accessible to substrate carriers that are engaged with the magnetic levitation tracks on the bottom surface as well as to substrate carriers that are engaged with the magnetic levitation tracks on the top surface. The slit valve openings can be sized according to the configuration of the transfer planes. The slit valve opening may be about 1 inch to about 20 inches for a single transfer plane and about 2 inches to about 20 inches when there are two transfer planes. For example, if there are two wafer transfer planes, the slit valve opening may be larger than if there is one wafer transfer plane.

According to embodiments, the system can include a first load lock and a second load lock (not shown). The first load lock can be accessible to substrate carriers that are engaged with the magnetic levitation track on the bottom surface. The second load lock can be stacked above the first load lock at the end of the transfer chamber 102. The second load lock can be accessible to substrate carriers that are engaged with the magnetic levitation track(s) on the top surface. In embodiments, a first height of the transfer chamber 102 at the end near the first load lock can be greater than a second height of a remainder of the transfer chamber 102. In further embodiments, the first load lock and the second load lock can be arranged in a side-by-side configuration at an angle relative to the length of the transfer chamber (e.g., a 30 or 45 degree angle).

According to embodiments, the system includes at least one vertical motion assembly 128A-E configured to receive a substrate 108 and to lift and/or lower the substrate between transfer planes and/or between magnetic levitation tracks. The vertical motion assembly 128A-E can include one or more lift pins, for example, a pair or trio of lift pins 130A-E. Alternatively, the vertical motion assembly may move substrate carriers using electromagnetism, lift plates (e.g., rotatable lifts), and/or other lift mechanisms, some of which are described in greater detail below. In the example of a lift pin assembly, the lift pins 130A-E can be configured to pass through the bottom surface 116 of the transfer chamber 102 and may have an atmospheric-facing side and a vacuum-facing side. The atmospheric-facing side can be outside of the bottom surface of the transfer chamber 102. The lift pins 130A-E may be enclosed in a bellows to maintain the vacuum environment in the transfer chamber. The lift pins 130A-E can be configured to extend into the transfer chamber 102 on the vacuum-facing side. In embodiments, the at least one vertical motion assembly 128A-E can be configured to move a substrate carrier 110 that is positioned in front of the first load lock in a vertical direction to cause the substrate carrier 110 to reach a transfer plane above the second height of the remainder of the transfer chamber 102 (discussed above). During operation, when a lift pin 130A-E or other lift mechanism lifts a substrate carrier 110, 110A-110C to a certain proximity with the top track 118, a magnetic field can be activated in the proximity of a substrate carrier. The magnetic field in the proximity of the substrate carrier 110, 110A-110C can be deactivated when a lift pin 130A-E or other lift mechanism engages with the substrate carrier 110, 110A-110C on the top track 118 to move the substrate to the lower track 112 via the lift pin 130A-E.

Figure 2A:
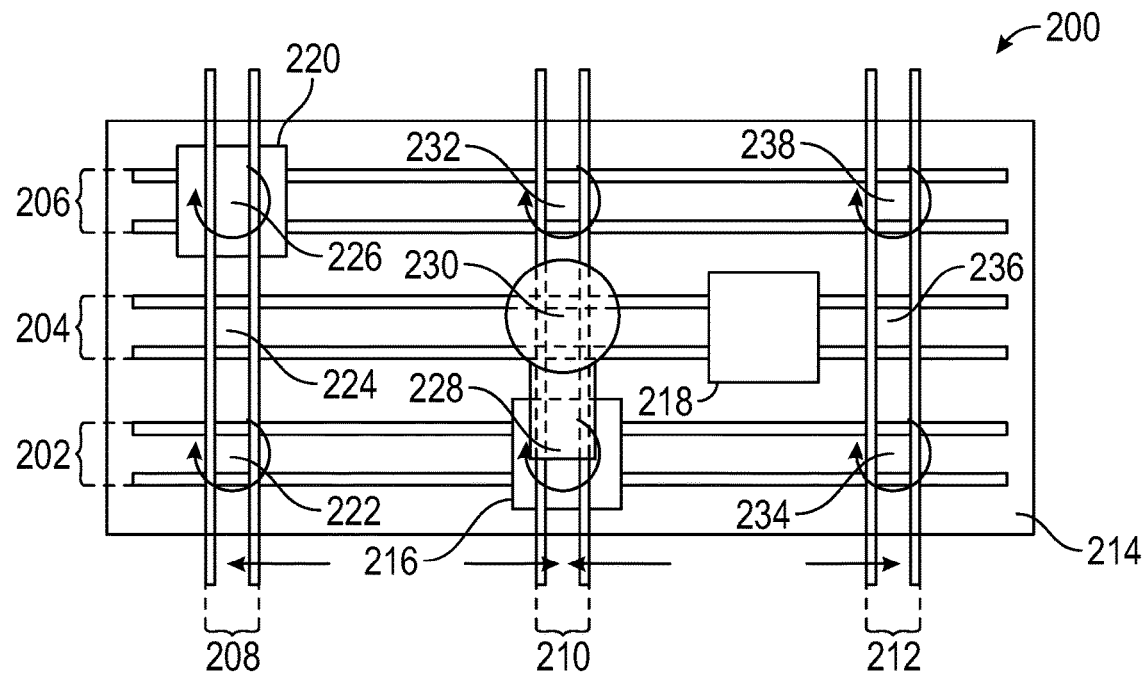
FIG. 2A depicts a top view of a magnetic levitation platform according to various embodiments.

FIG. 2A depicts a magnetic levitation platform 200 according to one or more embodiments described herein. As shown, a first longitudinal magnetic levitation track 202 runs along a bottom surface of a transfer chamber 214. Second and third longitudinal magnetic levitation tracks 204 and 206, respectively, also run along the bottom surface of the transfer chamber 214, parallel to the first longitudinal track 202. A linear motor (not shown) may be located beneath the bottom surface of the transfer chamber 214. The linear motor may generate motive force by a stator. Arranged perpendicularly to longitudinal tracks 202, 204, 206 are lateral tracks 208, 210, 212. In the embodiment depicted in FIG. 2A, the longitudinal tracks 202, 204, 206 are in a face up orientation at a first height. The lateral tracks 208, 210, 212 may be in a face up orientation at the first height, or in a face down orientation at a second height above the first height. While the longitudinal tracks 202, 204, 206 may be supported by a bottom surface of chamber 214, the lateral tracks 208, 210, 212 may be supported by a top and/or side surfaces (not shown) of chamber 214.

One or more substrate carriers 216, 218, 220 are configured to move back and forth on the longitudinal tracks 202, 204, 206 and lateral tracks 208, 210, 212. Substrate carriers 216, 220 may be configured to move on lateral tracks 208, 210 above while substrate carrier 218 moves on track 204 below. In one or more embodiments, substrate carriers 216, 218, 220 may be configured to vertically lift, lower and/or rotate at one or more junction 222, 224, 226, 228, 230, 232, 234, 236, 238. A junction 222, 224, 226, 228, 230, 232, 234, 236, 238 is formed where a longitudinal track 202, 204, 206 intersects a lateral track 208, 210, 212 as shown in FIG. 2A. A substrate carrier 216, 218, 220 may rotate, e.g., 90°, at a junction 222, 224, 226, 228, 230, 232, 234, 236, 238 to move from a longitudinal track 202, 204, 206 to a lateral track 208, 210, 212 and correspondingly change directions. In at least one embodiment, the magnetic levitation platform 200 is configured to lift and/or rotate a substrate carrier 216, 218, 220 at the junctions.

In at least one embodiment, substrate carriers 216, 218, 220 may include a pair of actuators, one for providing a vertical lift/lower function of the substrate carrier and another actuator for providing a rotation function of the substrate carrier or a turntable thereon. Magnetic bearings positioned on the outside of the turntable and may be configured to engage with the magnetic levitation tracks. For example, the substrate carrier may have a drive on the outside for lifting/lowering and a drive on the inside (e.g., within a center shaft) for rotation.

In one or more embodiments as described herein, one or more lift pin assemblies may be used to lift and lower a substrate carrier from a bottom track to an upper track, or vice versa. The lift pin assemblies may be isolated from atmosphere using bellows. Each lift pin assembly can have a set of lift pins that can lift a substrate carrier from the bottom track to the top track and/or substrate the substrate carrier from the top track to the bottom track. When the substrate carrier with the substrate attached thereto reaches a certain proximity to the top magnetic levitation track (e.g., sensed by a track sensing system), the top track may activate a magnetic field in the proximity of the substrate carrier, securing the substrate carrier to the top track.

In some embodiments, the substrate carrier is configured to move from a lower track to an upper track without a lift pin assembly. For example, the substrate carrier having magnets on a top surface and a bottom surface thereof utilizes magnetic attraction between the magnets and a respective magnetic levitation track to switch tracks. In one embodiment, a substrate carrier operating on a lower longitudinal track, such that a magnet on a bottom surface of the substrate carrier is engaged with the longitudinal track, may switch to an upper lateral track at a junction. A magnet on a top surface of the substrate carrier may engage with the lateral track, while at the same time disengaging with the lower longitudinal track moving the substrate carrier gently upward toward the upper lateral track. The same process may be followed to lower a substrate carrier from an upper lateral track to a lower longitudinal track.

In one or more embodiments, lateral tracks 208, 210, 212 may align with corresponding slit valves (not shown) and corresponding process chambers (not shown), so that tracks 208, 210, 212 can be used to load and unload substrates within the process chambers, while the longitudinal tracks 202, 204, 206 are utilized by substrate carriers 216, 218, 220 to move substrates along the length of the transfer chamber 214. For example, loading and unloading of substrates within the process chambers can occur on the upper lateral tracks independent of the lower longitudinal lanes below. In one embodiment, a substrate carrier 216, 218, 220 moving on track, e.g., 202 can switch to, e.g., track 210 at junction 228 and move along track 210 to junction 232 proximate a slit valve and process chamber. Similarly, process chambers and/or load locks can be positioned at either end of the longitudinal tracks 202, 204, 206 and a substrate carrier 216, 218, 220 can move from one end of the transfer chamber 214 to the other end of the transfer chamber to place substrates in a process chamber at the opposite end. In at least one embodiment, substrate carriers 216, 218, 220 can include turntables (not shown) positioned thereon such that the turntables are integrated with the frame body (e.g., stationary turntables) of the transfer chamber or tranfer tunnel.

One benefit of utilizing a magnetic levitation platform with at least three (3) longitudinal tracks 202, 204, 206 and/or at least three lateral tracks 208, 210, 212 is to prevent the blocking of a longitudinal lane upon rotation of a substrate carrier by 90°. As shown in FIG. 2A, substrate carrier 216 has rotated at junction 228 and overlies both longitudinal track 202 and longitudinal track 204. However, longitudinal track 206 remains unobstructed and can continue to operate while substrate carrier 216 is in the process of moving either vertically or laterally.

Figure 2B:
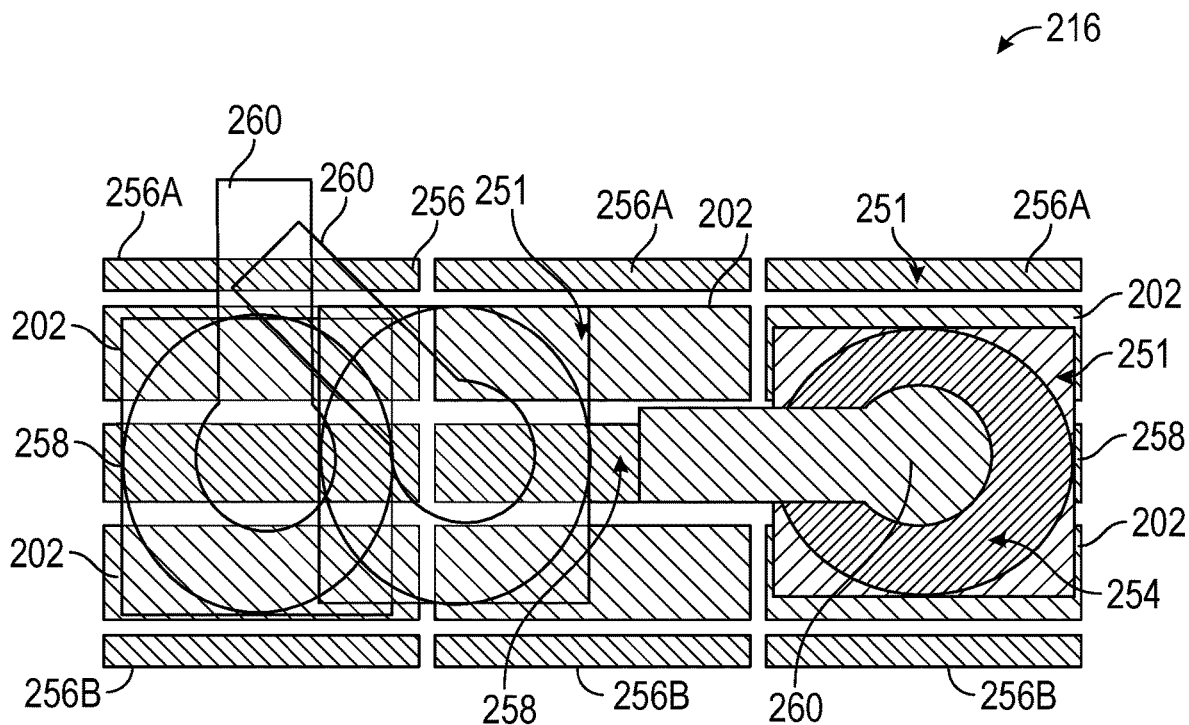
FIG. 2B depicts an embodiment of a substrate carrier for use with magnetic levitation platforms according to various embodiments.

An embodiment of a substrate carrier 216 suitable for use with a modular linear magnetic levitation track 252 is shown in FIG. 2B. The modular linear magnetic levitation track 252 may be positioned within a linear transfer tunnel (not shown). For example, opposite ends of the transfer tunnel may include one or more slit valves accessible to one or more process chamber, process chamber cluster, load lock, etc. One or more substrate carriers 200 may be configured to move between opposite ends of the liner transfer tunnel to pick and place substrates between the process chambers, clusters, load locks, etc.

Substrate carrier 216 can include a mover 251 on which a rotating disc 254 may be positioned. Along at least two sides of the mover 251, are a pair of stationary coils 256A, 256B. Stationary coils 258 may be positioned beneath mover 251 along the middle of mover 251 and between magnetic levitation tracks 252. Substrate carrier 216 is configured to move linearly along a magnetic levitation track 252 and to rotate a substrate arm 260, for example, from about ±90° to about ±180° to enable the substrate carrier 216 to either change directions and/or place a substrate within a process chamber (not shown). Stationary coils 258 are useful to provide linear motion of the substrate carrier 216 and substrate arm 260.

Rotating disc 254 may include a stationary active bearing (not shown) and corresponding drive parts (not shown).

Substrate carrier 216 may be considered a pure passive carrier. Rotating disc 254 may further include a passive rotational magnetic bearing 256 on a top surface thereof, which may be configured to provide rotation angles of up to about ±180°.

Figure 3A:
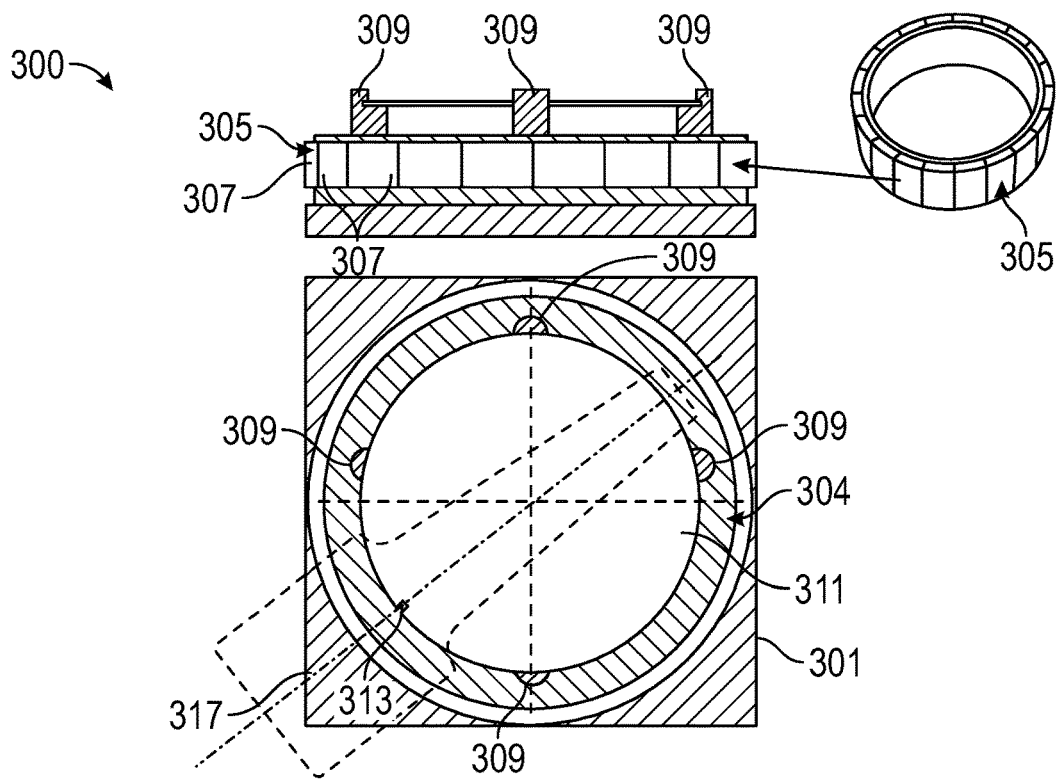
FIG. 3A depicts an embodiment of a substrate carrier for use with magnetic levitation platforms according to various embodiments.
Figure 3B:
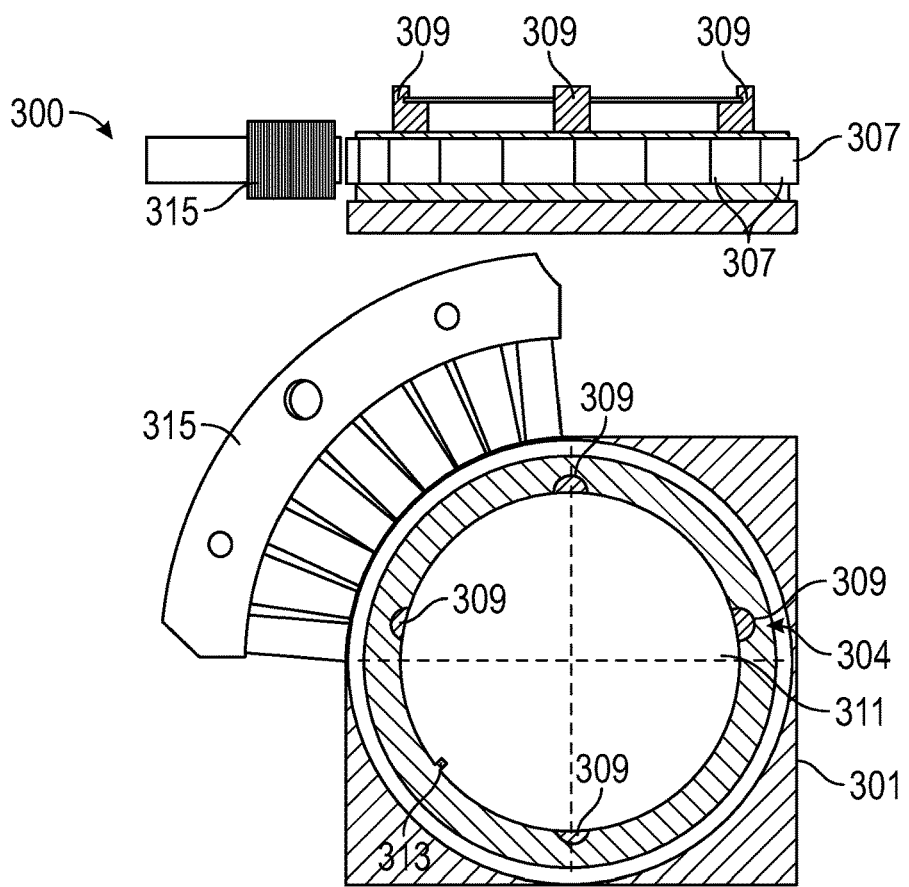
FIG. 3B depicts an embodiment of a substrate carrier for use with magnetic levitation platforms according to various embodiments.

Another embodiment of a substrate carrier 300 is shown in FIGS. 3A and 3B. Substrate carrier 300 is suitable for use in magnetic levitation platforms, e.g., as shown in FIGS. 1A-2A, according to various embodiments described herein. Substrate carrier 300 may include only passive components in the moving parts. Substrate carrier 300 does not include any electrical current or battery. Substrate carrier 300 includes a turntable 304 positioned on a mover 301. Turntable 304 can include a frictionless magnetic bearing 305 formed of a ring of permanent magnets 307 and a torsional spring (not shown). Substrate carrier 300 may further include a plurality of substrate pins 309 configured to support a substrate 311 when the substrate carrier 300 is transferring a substrate 311 from one location to another. The substrate pins 309 may be positioned on bearing 305 as shown in FIGS. 3A and 3B.

In some embodiments, substrate 311 may include a notch 313, which can be used together with a notch finder 317 to align the substrate 311 with a slit valve, the process chamber and/or a robot arm following transport on the substrate carrier 300 and before entry into a process chamber. The notch finder 317 may employ an optical absolute encoder (not shown) to provide high precision alignment. Notch finder 317 additionally or alternatively can include Hall-sensors to provide alignment.

In one or more embodiments, the transfer chamber or transfer tunnel (not shown) may further include an active drive segment 315 comprised of one or more coils. The active drive segment 315 may be attached to the chamber or tunnel as shown in FIG. 3B. Each end of the chamber or tunnel may include an active drive segment 315. The active drive segment 315 may be attached to a corner at the end of the chamber or tunnel and may have a span of about 90° as shown in FIG. 3B. Drive segment 315 can be fully encapsulated with a material (e.g., sheet metal) to cover any air gaps formed between the outer edge of the active drive segment 315 and the chamber or tunnel interior surface.

Figure 3C:
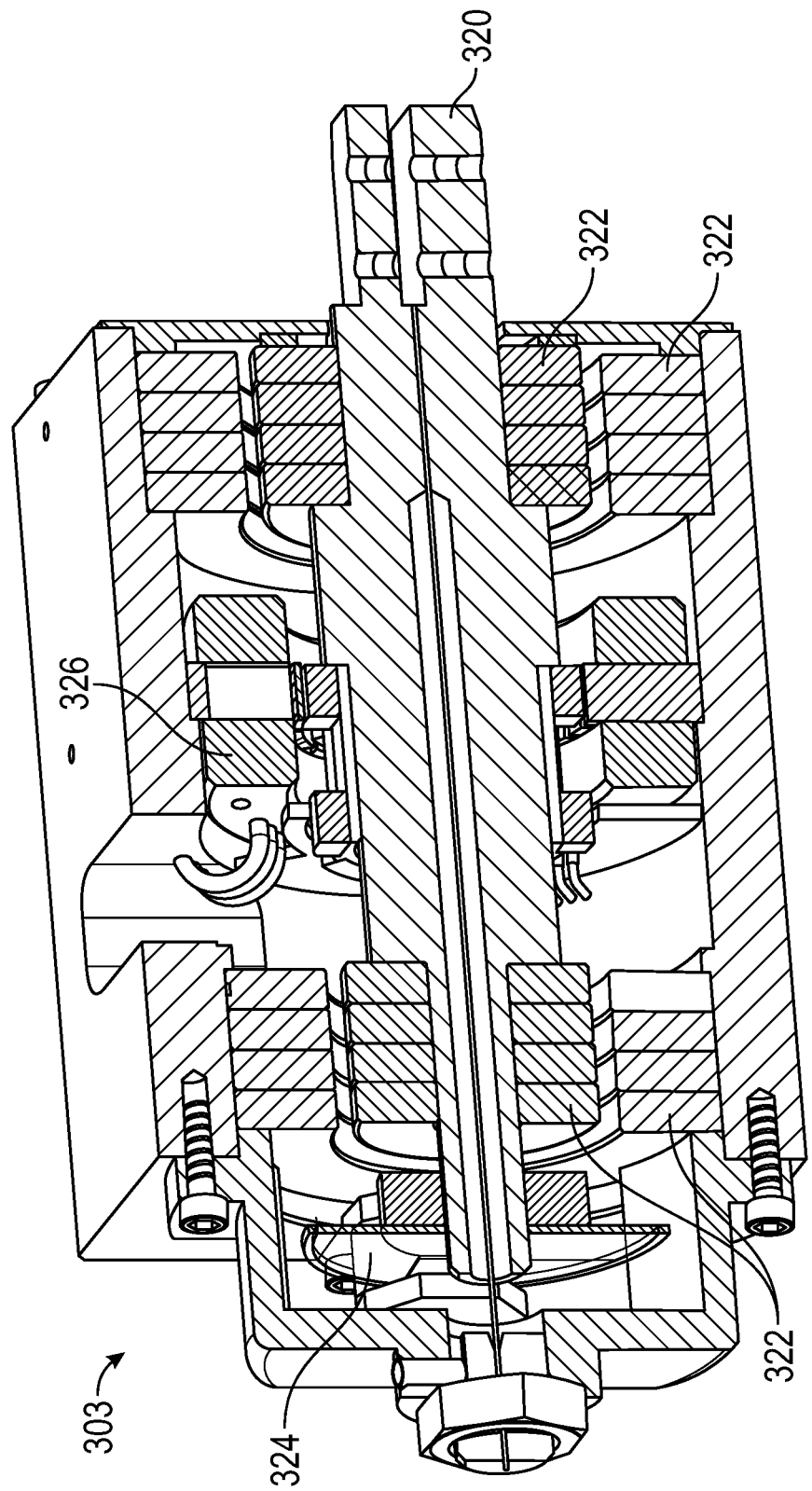
FIG. 3C depicts an embodiment of a magnetic bearing suitable for use with a substrate carrier for a magnetic levitation track according to various embodiments.

A passive rotational bearing assembly 303 suitable for use with one or more substrate carriers according to embodiments herein is shown in FIG. 3C. A torsional spring 306 extends along an inner shaft 320 of bearing assembly 303. Permanent magnets 322 may be positioned about shaft 320 to provide axial polarization. Encoder 324 may be used to monitor the speed, distance and/or direction of rotation of shaft 320. Drive 326 is configured to rotate shaft 320. Bearings having permanent magnets are unstable (i.e., pursuant to Earnshaw's law). At least one degree of freedom (or inertia) is used to actively stabilize such bearings. The bearing setup leads to a force that pushes the shaft to the right. The bearing uses a torsional spring to carry that pushing force and keep the rotational DOF without relative motion/slip. The torsional spring is configured to return the magnetic bearing 305 to a default position when not in contact with an active coil. The ring of permanent magnets 307 may be configured for use as a rotational drive or a reluctance/stepper-type drive. Substrate carrier 300 is configured to rotate up to about ±180°. The torsional spring may be positioned along a center shaft of the passive bearings with the permanent magnets positioned about the shaft. The bearing configuration leads to a force that pushes the shaft to the right, so the bearing uses a torsional spring to carry that pushing force and keep rotational DOF without relative motion/slip. The bearing returns to a default position without contacting to active coil.

Figure 4:
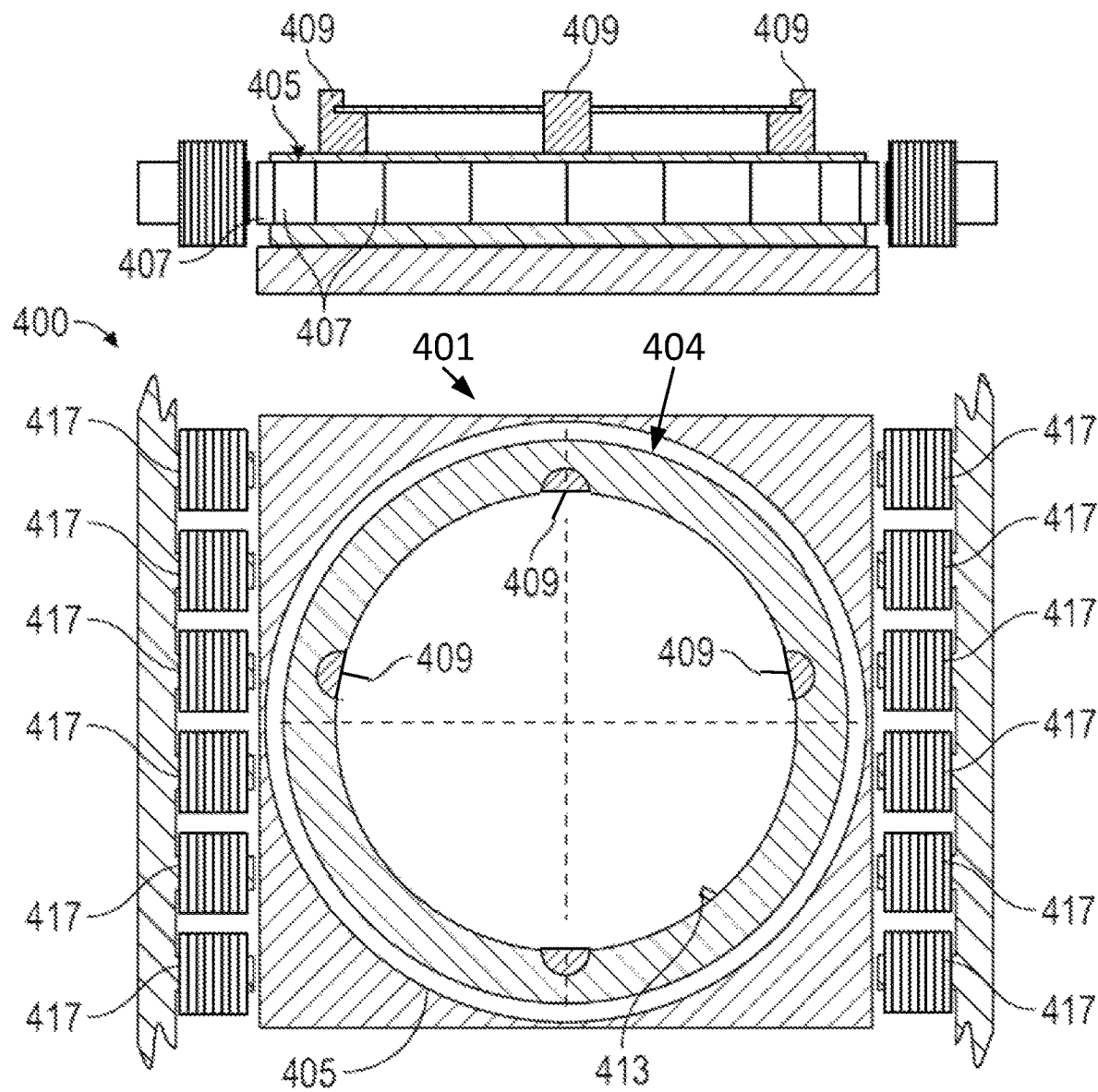
FIG. 4 depicts an embodiment of a substrate carrier for use with magnetic levitation platforms according to various embodiments.

Another embodiment of a substrate carrier 400 is shown in FIG. 4. Substrate carrier 400 is suitable for use in magnetic levitation platforms, e.g., as shown in FIGS. 1A-2A, according to various embodiments described herein. In at least one embodiments, substrate carrier 400 is suitable for use in a magnetic levitation platform having stacked (or two levels) magnetic levitation tracks. Substrate carrier 400 may be considered a pure passive carrier including only passive components in the moving parts. Substrate carrier 400 includes a turntable 404 positioned on a mover 401. Turntable 404 can include a frictionless magnetic bearing 405 formed of a ring of permanent magnets 407 and a torsional spring (not shown). Substrate carrier 400 further includes one or more coils 417 positioned on opposite sides of mover 401/bearing 405 as shown in FIG. 4. The positioning of coils on both sides of the mover 401/bearing 405 can eliminate radial forces and/or can double torque forces. The torsional springs are configured to return the magnetic bearing 405 to a default position when not in contact with an active coil 417.

Substrate carrier 400 is configured to rotate up to about ±180°. Substrate carrier 400 may further include a plurality of substrate pins 409 configured to support a substrate 411 when the substrate carrier 400 is transferring a substrate 411 from one location to another. The substrate pins 409 may be positioned on bearing 405 as shown in FIG. 4.

In some embodiments, substrate 411 may include a notch 413, which can be used together with a notch finder (not shown) to align the substrate 411 with a slit valve, the process chamber and/or a robot arm following transport on the substrate carrier 400 and before entry into a process chamber. The notch finder may employ an optical absolute encoder (not shown) to provide high precision alignment. The notch finder additionally or alternatively can include Hall-sensors to provide alignment.

In the illustrated embodiment a synchronous drive with permanent magnets 407 on mover 401 is shown. However, in other embodiments the mover 401 may include a reluctance drive.

Another embodiment of a substrate carrier 500 is shown in FIGS. 5A-B. Substrate carrier 500 may be in a stacked configuration with two vertical levels operable to support one or two substrates 511. A frame 524 includes a bottom surface and side and top structures with substrate pins 509 on which a substrate 511 can be supported during transport. Substrate carrier 500 may be a passive mover with magnets on the top and bottom 520, 522. Magnets 520, 522 may be configured to engage with one or more longitudinal magnetic levitation track and/or one or more lateral magnetic levitation track.

Figure 6:
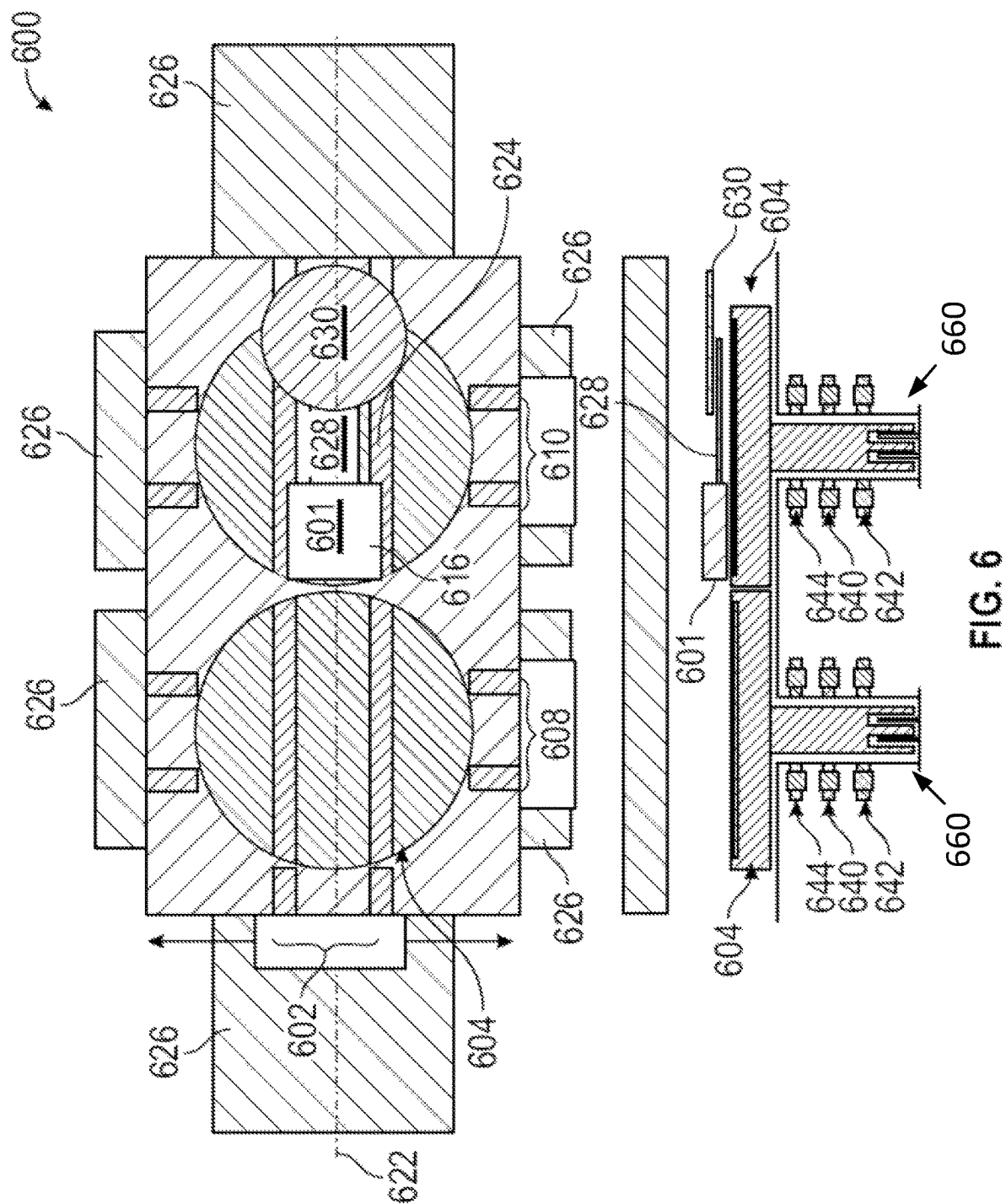
FIG. 6 depicts a magnetic levitation platform having upper and lower magnetic levitation tracks according to various embodiments.

An embodiment of a magnetic levitation platform 600 is shown in FIG. 6. Arranged around a transfer chamber 614 is a plurality of process chambers and/or load locks 626. Longitudinal magnetic levitation tracks 602 run along the length of the transfer chamber 614 at a first height within the transfer chamber 614. Located at opposite ends of longitudinal magnetic levitation tracks 602 are process chambers 626. Substrate carrier 616 is configured to move linearly along longitudinal tracks 602 between the process chambers 626 at each end. Substrate carrier 616 may be any suitable carrier as described herein. Running perpendicular to longitudinal tracks 602 are lateral magnetic levitation tracks 608, 610. Located at opposite ends of each of the lateral tracks 608, 610 are process chambers 626. Substrate carrier 616 also is configured to move linearly along lateral tracks 608, 610. Lateral tracks 608, 610 may be at a second height within the transfer chamber 614, below the first height.

The plane of each lateral track 608, 610 intersects the plane of longitudinal tracks 602 at junctions 622, 624. Substrate carrier 616 can move between longitudinal tracks 602 and lateral tracks 608, 610 at junctions 622, 624. Turntable 604 is configured to rotate substrate carrier 616 up to about ±180°. Substrate carrier 616 can include a mover 601 having an end effector 628 attached thereto and configured to support a substrate 630. In this embodiment, turntable 604 may be driven by a direct drive 640 coupled with lower bearings 642 and upper bearings 644. As such, turntable 604 will be supplied with power to operate the direct drive 640.

In embodiments, the turntable 706 is capable of performing a vertical lift (e.g., moving vertically). In embodiments, an actuator 660 is provided to move the turntable 706 vertically.

The turntable may have a rotational axis, may be magnetically levitated, and may be moved vertically by actuator 660. Accordingly, the mover can be switched between an upper and lower track. In an example, the mover may be similar to the mover illustrated in FIG. 5, but without a 90° rotation of track between a top and bottom side.

Figure 7:
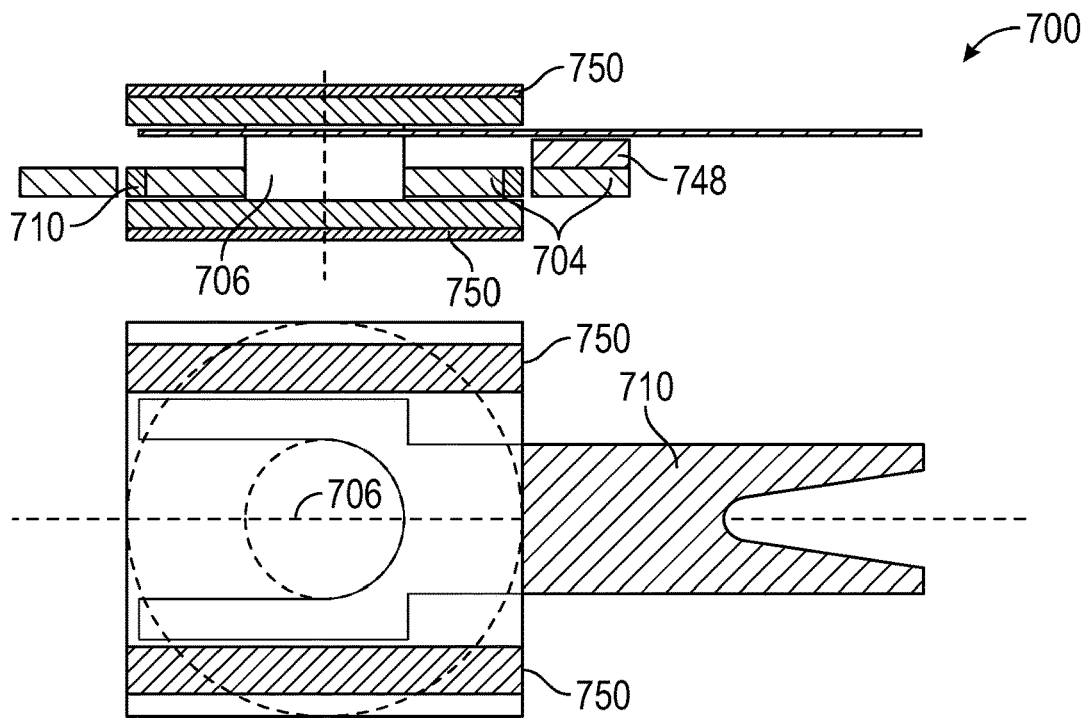
FIG. 7 depicts an embodiment of a substrate carrier for use with magnetic levitation platforms according to various embodiments.

Another embodiment of a substrate carrier 700 is shown in FIG. 7. Substrate carrier 700 can include a rotational drive having a passive magnetic bearing 710. The active rotation components 704 (e.g., magnets and bearings) are may be integrated within and/or attached to a transfer chamber body (not shown). A horizontal stroke bearing 748 also may be integrated within or attached to the transfer chamber together with the active components for rotation. The horizontal stroke bearing 748 is configured to control the amount of rotation of turntable 604, for example, by up to about 200 mm or about 50 mm to about 200 mm. Substrate carrier 700 may be configured to engage with a magnetic levitation drive many be positioned on the bottom and the top in a horizontal direction 750.

Figure 8:
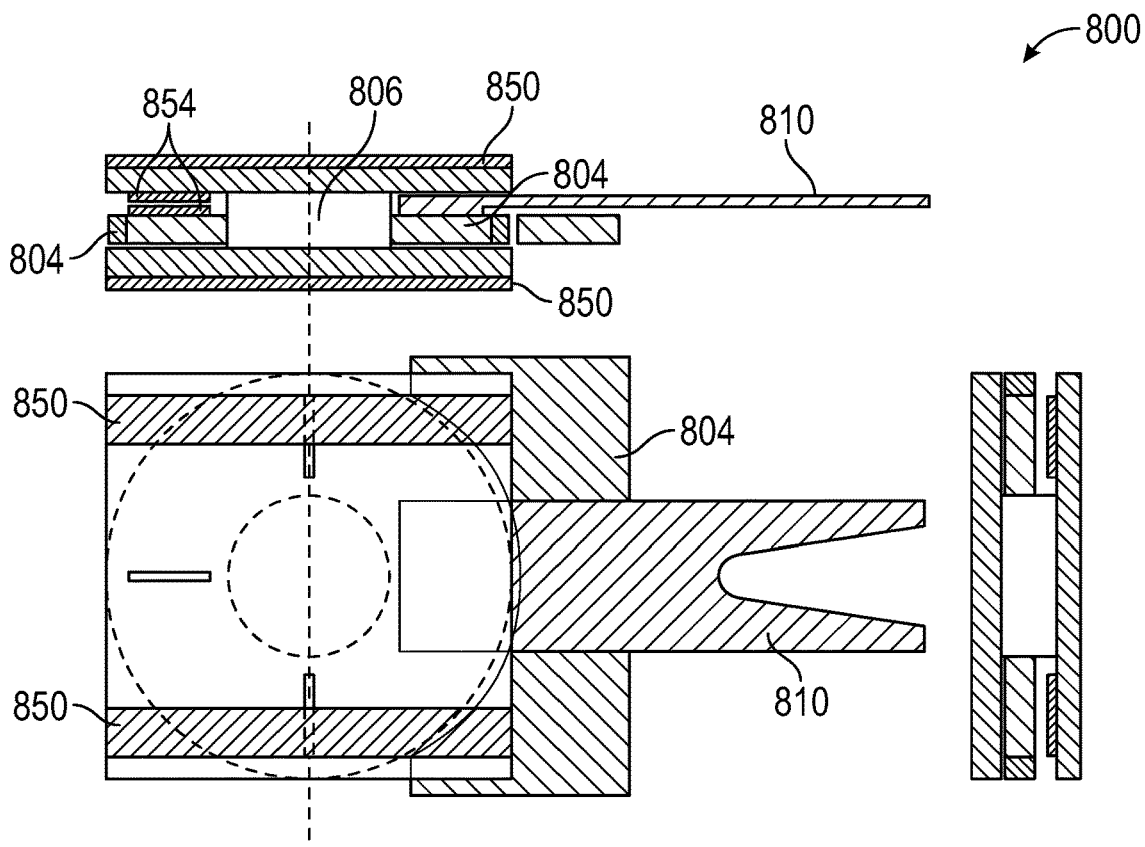
FIG. 8 depicts an embodiment of a substrate carrier for use with magnetic levitation platforms according to various embodiments.

Another embodiment of a substrate carrier 800 is shown in FIG. 8. Substrate carrier 800 can include a rotational drive having a passive magnetic bearing 810. The active rotation components 804 (e.g., magnets and bearings) are may be integrated within and/or attached to a transfer chamber body (not shown). Substrate carrier 800 may be configured to engage with a magnetic levitation drive many be positioned on the bottom and the top in a horizontal direction 850. Substrate carrier 800 further includes lateral, self-centering magnets 854 to provide centering of turntable 806 during operation.

Figure 9A:
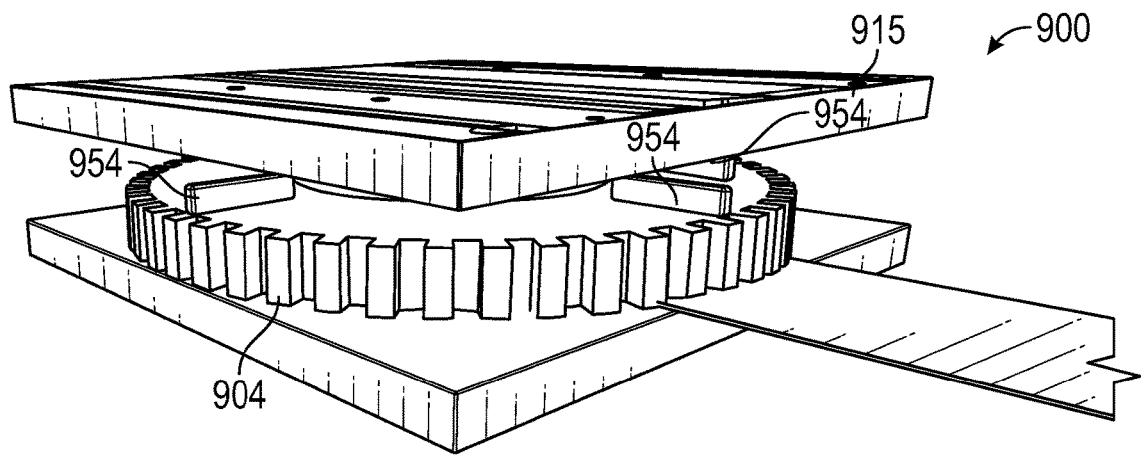
FIG. 9A depicts a perspective view of an embodiment of a substrate carrier for use with magnetic levitation platforms according to various embodiments.

Another embodiment of a substrate carrier 900 is shown in FIG. 9A. Substrate carrier 900 is fully passive and includes a rotational bearing 904. In some embodiments, substrate carrier 900 may be operable by a reluctance drive. A reluctance motor is a type of electric motor that induces non-permanent magnetic poles on the ferromagnetic rotor. The rotor does not have any windings and generates torque through magnetic reluctance. The reluctance motor may be synchronous, variable, switched or variable stepping.

In embodiments, substrate carrier 900 is effectively a reluctance drive. In other embodiments, other types of drives other than reluctance drives may also be used. For example, a synchronous drive may be used with permanent magnets in an embodiment. As shown, substrate carrier 900 includes a gear with multiple teeth. Substrate carrier 900 may additionally include an X, Y drive. Accordingly, substrate carrier 900 includes a reluctance drive, but is set up in a manner that has two degrees of freedom and levitation at the same time.

Figure 9B:
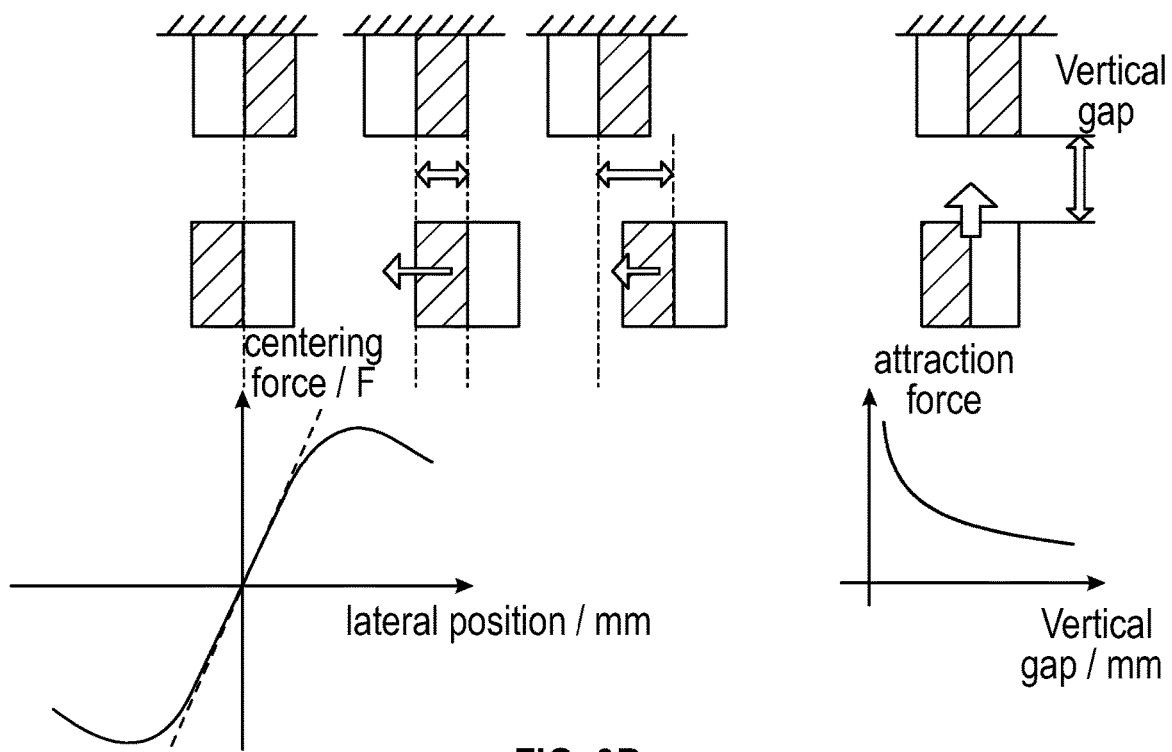
FIG. 9B depicts the centering force as a function of lateral position of centering magnets of a substrate carrier according to various embodiments.

Attached to rotational bearing 904 are one or more self-centering magnets 954. In at least one embodiment, the torque requirements of rotational bearing 904 include a centering force of the self-centering magnet's 954, having a radius that is greater than the torque of the torsional spring (not shown) within the bearing 904 as illustrated in FIG. 9B. The torque requirements may further include a torque of the drive segment greater than that of the torsional spring plus the maximum centering force. For example, when the lateral position of magnet 954 is at 0 mm, the centering force is also at 0. As the lateral position of magnet 954 increases above 0 mm, the centering force increases and as the lateral position of magnet 954 decreases below 0 mm. Another one or more self-centering magnets (not shown) may be positioned above those on bearing 906 attached to top support 915. As the vertical gap between the two sets of magnets increases, the attraction force decreases.

Figure 10:
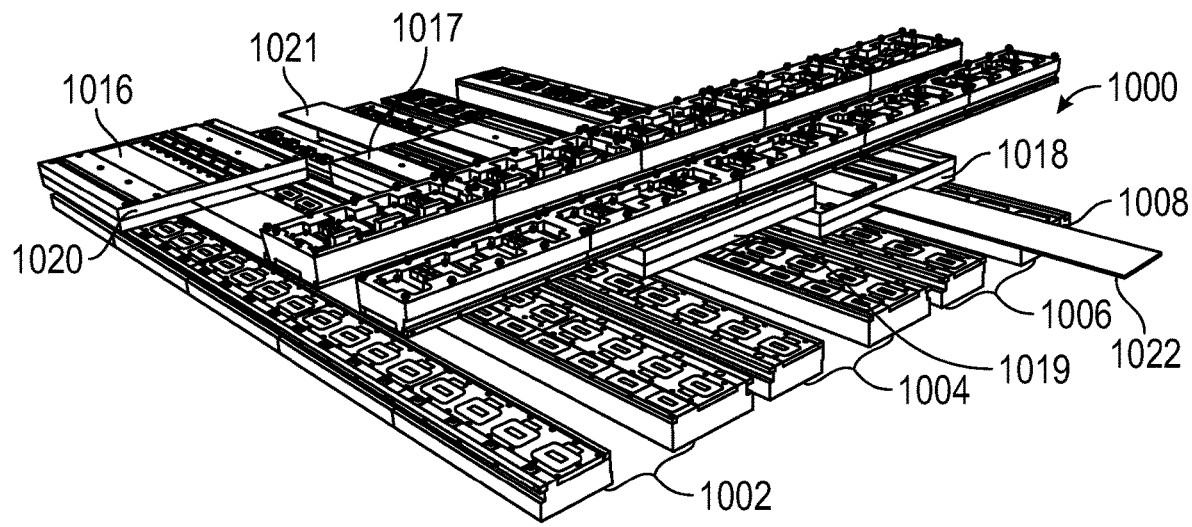
FIG. 10 depicts a perspective view of a magnetic levitation platform according to various embodiments.

Another embodiment of a magnetic levitation platform 1000 is shown in FIG. 10. Platform 1000 includes three (3) longitudinal magnetic levitation tracks 1002, 1004, 1006 and one lateral magnetic levitation track 1008. Longitudinal tracks 1002, 1004, 1006 are at a first height, while lateral track 1008 is at a second height above the first height. A plurality of substrate carriers 1016, 1017, 1018, 1019 are configured to move along the longitudinal and lateral tracks 1002, 1004, 1006, 1008 as shown. Longitudinal tracks 1002, 1004, 1006 are in a face-up orientation (e.g., positioned on a bottom surface of a transfer chamber or transfer tunnel) and lateral track 1008 is positioned in a face-down orientation where the lateral tracks are attached to or integrated within the transfer chamber o transfer tunnel. Each substrate carrier 1016, 1017, 1018 has a corresponding substrate support 1020, 1021, 1022 where the support for substrate carrier 1019 is not shown. Each substrate carrier 1016, 1017, 1018, 1019 includes at least one magnet on a top surface and at least one magnet on a bottom surface thereof such that the substrate carriers 1016, 1017, 1018, 1019 are configured to engage and move along any of the longitudinal and lateral tracks 1002, 1004, 1006, 1008. Substrate carriers 1002, 1004, 1006, 1008 may further include a bearing and drive assembly according to various embodiments herein configured to rotate the substrate carriers by up to about ±180°.

Figure 11:
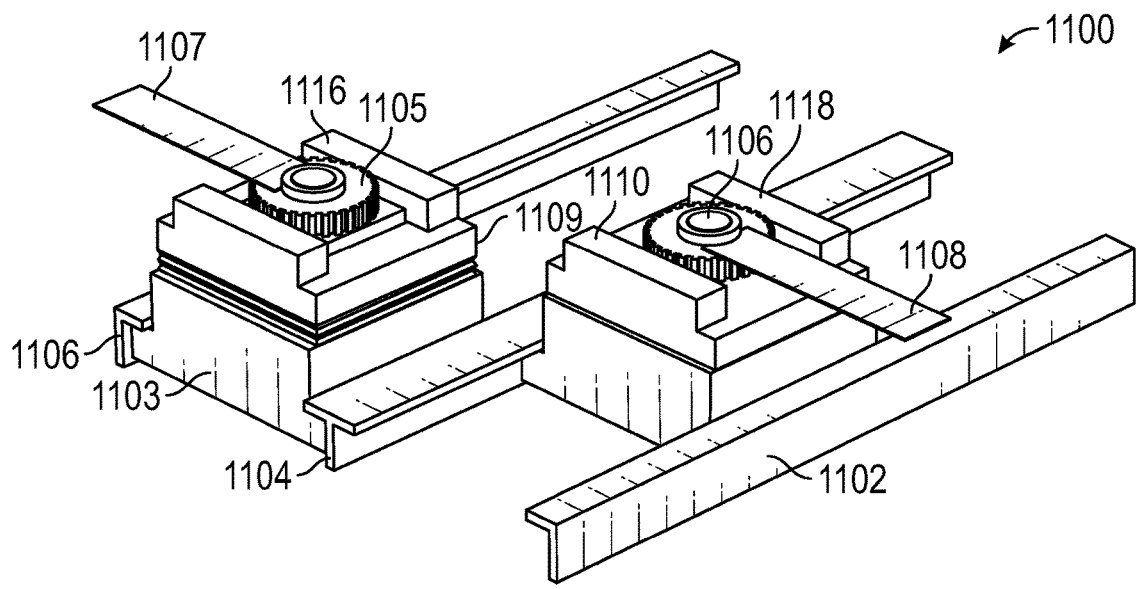
FIG. 11 depicts a perspective view of a magnetic levitation platform and substrate carrier according to various embodiments.

Another embodiment of a magnetic levitation platform 1100 and corresponding substrate carriers 1116, 1118 is shown in FIG. 11. System 1100 includes a plurality of magnetic levitation tracks 1102, 1104, 1106 along which substrate carriers 1116, 1118 that can move in a linear direction. Substrate carriers 1116, 1118 each include a mover 1103 and rotational bearings 1105, 1106 attached to which are end effectors 1107, 1108. Movers 1103 are operable by a standard energy coupling (e.g., an electrical wire) and moving magnets (not shown). In this embodiment, a transfer chamber or tunnel in which platform 1100 resides can include passive platform 1109, 1110 for rotation and linear motion on a top surface of the chamber or tunnel. Platform 1100 may further include a lift assembly (e.g., lift pin assembly) to lift passive platform 1109, 1110 from within the carrier 1116, 1118, which is sealed by a bellow. Though not shown, an additional set of magnetic levitation tracks may be positioned above the substrate carriers 1116, 1118, which may be longitudinal or lateral magnetic levitation tracks. The substrate carriers 1116, 1118 may be moved between the upper and lower magnetic levitation tracks.

Figure 12:
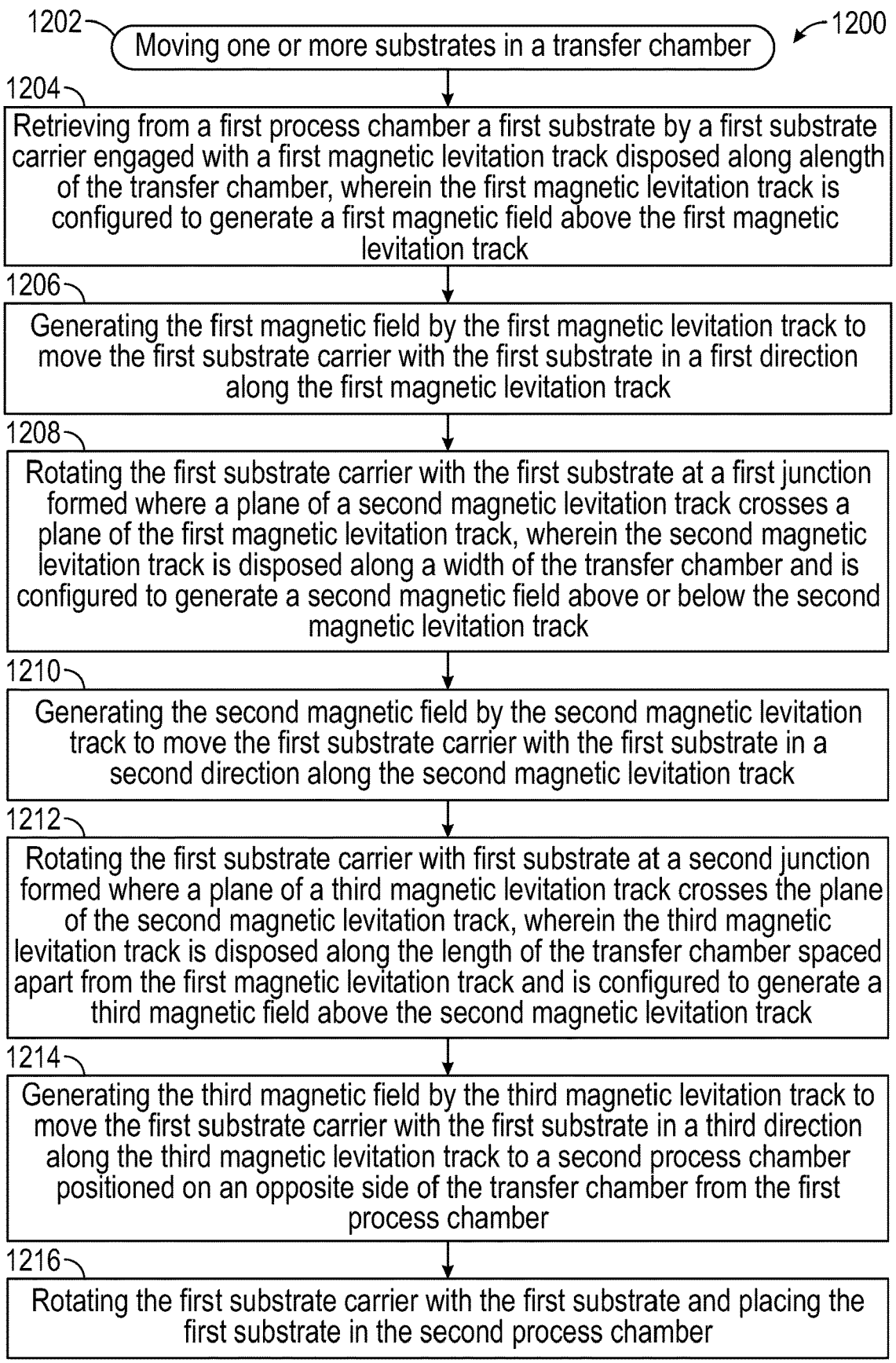
FIG. 12 illustrates a method of moving a wafer through a transfer chamber according to various embodiments.

Further described herein are methods 1200 of moving one or more substrates in a transfer chamber (block 1202) as shown in FIG. 12. At block 1204, method 1200 includes retrieving from a first process chamber (or a first load lock) a first substrate by a first substrate carrier engaged with a first magnetic levitation track disposed along a length of the transfer chamber. The first magnetic levitation track may be configured to generate a first magnetic field above the first magnetic levitation track.

At block 1206, method 1200 includes generating the first magnetic field by the first magnetic levitation track to move the first substrate carrier with the first substrate in a first direction along the first magnetic levitation track.

At block 1208, method 1200 may include rotating the first substrate carrier with the first substrate at a first junction formed where a plane of a second magnetic levitation track crosses a plane of the first magnetic levitation track. The second magnetic levitation track is disposed along a width of the transfer chamber and is configured to generate a second magnetic field above or below the second magnetic levitation track.

At block 1210, method 1200 includes generating the second magnetic field by the second magnetic levitation track to move the first substrate carrier with the first substrate in a second direction along the second magnetic levitation track Method 1200 further includes, at block 1212, rotating the first substrate carrier with first substrate at a second junction formed where a plane of a third magnetic levitation track crosses the plane of the second magnetic levitation track. The third magnetic levitation track may be disposed along the length of the transfer chamber spaced apart from the first magnetic levitation track. The third magnetic levitation track is configured to generate a third magnetic field above the third magnetic levitation track.

At block 1214, method 1200 includes generating the third magnetic field by the third magnetic levitation track to move the first substrate carrier with the first substrate in a third direction along the third magnetic levitation track to a second process chamber positioned on an opposite side of the transfer chamber from the first process chamber. For example, the first substrate is moved from one side of the transfer chamber to another side of the transfer chamber.

Method 1200 may further include, at block 1216, rotating the first substrate carrier with the first substrate and placing the first substrate in the second process chamber. Enabling random movement of substrates within the process chamber can increase substrate throughput through the processing system and ultimately increase yield.

In some embodiments, method 1200 can include rotating the first substrate carrier at a second junction formed where a third magnetic levitation track crosses the second magnetic levitation track proximate to the bottom surface of the transfer chamber, wherein the third magnetic levitation track has a face-up orientation configured to generate a third magnetic field above the third magnetic levitation track and generating the third magnetic field by the third magnetic levitation track to move the first substrate carrier with the first substrate in a third direction along the third magnetic levitation track. For example, a substrate may move along a longitudinal track, then transfer to a lateral track at a junction and then transfer again to a different longitudinal track by changing direction, e.g., by 90° at each junction. As such, the substrate can quickly move from one process chamber to another utilizing open magnetic levitation lanes.

In some embodiments, method 1200 includes lifting, with a first lift pin assembly, the first substrate carrier to a third magnetic levitation track positioned proximate a top surface of the transfer chamber. The third magnetic levitation track can have a face-down orientation and may be configured to generate a third magnetic field below the third magnetic levitation track. The magnetic levitation platform system may be configured to detect that the first substrate carrier is proximate to the third magnetic levitation track. A third magnetic field may be generated to suspend the first substrate carrier below the third magnetic levitation track and to move the first substrate carrier with the first substrate in a third direction along the third magnetic levitation track.

In at least one embodiment of method 1200, the at least one substrate carrier is configured to move along the first magnetic levitation track and the second magnetic levitation track. The substrate carrier may be any suitable carrier according to embodiments described herein. In one embodiment, the at least one substrate carrier may include a passive rotational magnetic bearing configured to rotate the substrate carrier. Additionally or alternatively, the substrate carrier may include a mirrored drive segment configured to rotate the substrate carrier. In some embodiments, the substrate carrier may include a stationary active bearing and drive assembly configured to rotate a turntable on a top surface of the substrate carrier. In yet further embodiments, the substrate carrier may include a rotational drive configured to rotate a passive magnetic bearing. In at least one embodiment, the substrate carrier may include a first magnet on a bottom surface of the substrate carrier and a second magnet on a top surface of the substrate carrier, wherein the first magnet is configured to interact with the first and second magnetic levitation tracks and the second magnet is configured to interact with third and fourth magnetic levitation tracks positioned on a top surface of the transfer chamber.

Reference throughout this specification to, for example, "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

As used herein, the singular forms "a," "an," and "the" include plural references unless the context clearly indicates otherwise. Thus, for example, reference to "a track" includes a single track as well as more than one track.

As used herein, the term "about" in connection with a measured quantity, refers to the normal variations in that measured quantity as expected by one of ordinary skill in the art in making the measurement and exercising a level of care commensurate with the objective of measurement and the precision of the measuring equipment. In certain embodiments, the term "about" includes the recited number ±10%, such that "about 10" would include from 9 to 11.

The term "at least about" in connection with a measured quantity refers to the normal variations in the measured quantity, as expected by one of ordinary skill in the art in making the measurement and exercising a level of care commensurate with the objective of measurement and precisions of the measuring equipment and any quantities higher than that. In certain embodiments, the term "at least about" includes the recited number minus 10% and any quantity that is higher such that "at least about 10" would include 9 and anything greater than 9. This term can also be expressed as "about 10 or more." Similarly, the term "less than about" typically includes the recited number plus 10% and any quantity that is lower such that "less than about 10" would include 11 and anything less than 11. This term can also be expressed as "about 10 or less."

Unless otherwise indicated, all parts and percentages are by weight. Weight percent (wt. %), if not otherwise indicated, is based on an entire composition free of any volatiles, that is, based on dry solids content.

The preceding description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the scope of the present invention.

Although the operations of the methods herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A transfer chamber for an electronic device processing system, comprising:
    a magnetic levitation platform, comprising:
        a first magnetic levitation track disposed along a horizontal length of the transfer chamber and configured to generate a first magnetic field above the first magnetic levitation track;
        a second magnetic levitation track disposed along a horizontal width of the transfer chamber, wherein a plane of the second magnetic levitation track crosses a plane of the first magnetic levitation track at a first junction, wherein the second magnetic levitation track is configured to generate a second magnetic field above or below the second magnetic levitation track; and
    at least one substrate carrier configured to move along the first magnetic levitation track and the second magnetic levitation track, wherein the substrate carrier is configured to rotate at the first junction.

2. The transfer chamber of claim 1, further comprising at least one of:
    (i) a third magnetic levitation track disposed along the horizontal length of the transfer chamber spaced apart from the first magnetic levitation track, wherein the second magnetic levitation track is disposed across the third magnetic levitation track at a second junction; or
    (ii) a fourth magnetic levitation track disposed along the horizontal width of the transfer chamber spaced apart from the second magnetic levitation track, wherein the fourth magnetic levitation track is disposed across the first magnetic levitation track at a third junction.

3. The transfer chamber of claim 2, further comprising at least one of:
    (iii) a fifth magnetic levitation track disposed along the horizontal length of the transfer chamber spaced apart from the first magnetic levitation track and the third magnetic levitation track, wherein the second and fourth magnetic levitation tracks are disposed across the fifth magnetic levitation track; or
    (iv) a sixth magnetic levitation track disposed along the horizontal width of the transfer chamber spaced apart from the second magnetic levitation track and the fourth magnetic levitation track, wherein the sixth magnetic levitation track is disposed across the first, third and fifth magnetic levitation tracks.

4. The transfer chamber of claim 3, wherein the first and third, and third and fifth magnetic levitation tracks are spaced apart a distance of about 350 mm to about 450 mm.

5. The transfer chamber of claim 1, wherein the at least one substrate carrier is configured to move along the first magnetic levitation track and the second magnetic levitation track, wherein the at least one substrate carrier comprises at least one of:
    a passive rotational magnetic bearing configured to rotate the substrate carrier; or
    a mirrored drive segment configured to rotate the substrate carrier; or
    a stationary active bearing and drive assembly configured to rotate a turntable on a top surface of the substrate carrier; or
    a rotational drive configured to rotate a passive magnetic bearing.

6. The transfer chamber of claim 1, wherein the at least one substrate carrier comprises an end effector for holding a substrate, wherein at least one of the first magnetic levitation track or the second magnetic levitation track is configured to cause the substrate carrier to rotate to place the substrate into a process chamber connected to the transfer chamber.

7. The transfer chamber of claim 1, further comprising a plurality of ports in sidewalls of the transfer chamber, wherein the plurality of ports are a plurality of slit valves accessible to the at least one substrate carrier, and wherein the second magnetic levitation track is proximate to a subset of the plurality of ports on a first side of the transfer chamber and is usable to transfer a substrate into a process chamber through one of the plurality of ports.

8. The transfer chamber of claim 1, wherein a first horizontal plane of the first magnetic levitation track is at a different height than a second horizontal plane of the second magnetic levitation track.

9. The transfer chamber of claim 8, further comprising an assembly for transferring the at least one substrate carrier from the first magnetic levitation track to the second magnetic levitation track, comprising:
    a magnetic bearing comprising:
    a shaft and a torsional spring positioned within the shaft;
    a plurality of permanent magnets concentric to the shaft;
    an encoder configured to monitor at least one of speed, distance or direction of rotation of the shaft; and
    a drive configured to rotate the shaft.

10. A transfer chamber for an electronic device processing system, comprising:
    a magnetic levitation platform, comprising:
        a first magnetic levitation track disposed along a horizontal length of the transfer chamber at a first height within the transfer chamber and configured to generate a first magnetic field above the first magnetic levitation track;
a second magnetic levitation track disposed along a horizontal width of the transfer chamber at a second height within the transfer chamber, wherein the second magnetic levitation track is configured to generate a second magnetic field below the second magnetic levitation track; and
at least one substrate carrier configured to move along the first magnetic levitation track and the second magnetic levitation track, wherein the substrate carrier is configured to move from the first magnetic levitation track to the second magnetic levitation track at a point of intersection between a plane of the first magnetic levitation track and a plane of the second magnetic levitation track.

11. The transfer chamber of claim 10, further comprising at least one of:
(i) a third magnetic levitation track disposed along the horizontal length of the transfer chamber at the first height spaced apart from the first magnetic levitation track and configured to generate a third magnetic field above the third magnetic levitation track, wherein the plane of the second magnetic levitation track intersects a plane of the third magnetic levitation track; or
(ii) a fourth magnetic levitation track disposed along the horizontal width of the transfer chamber at the second height spaced apart from the second magnetic levitation track and configured to generate a fourth magnetic field below the fourth magnetic levitation track, wherein the plane of the first magnetic levitation track and the plane of the third magnetic levitation track intersect a plane of the fourth magnetic levitation track.

12. The transfer chamber of claim 11, wherein the first and third magnetic levitation tracks are spaced apart a distance of about 40 mm to about 300 mm, and wherein the second and fourth magnetic levitation tracks are spaced apart a distance of about 40 mm to about 300 mm.

13. The transfer chamber of claim 11, wherein the at least one substrate carrier is configured to move along the first, second, third and fourth magnetic levitation tracks, wherein the at least one substrate carrier comprises:
a first magnet on a bottom surface of the substrate carrier and a second magnet on a top surface of the substrate carrier, wherein the first magnet is configured to interact with the first and third magnetic levitation tracks and the second magnet is configured to interact with the second and fourth magnetic levitation tracks.

14. The transfer chamber of claim 10, further comprising:
at least one lift pin assembly configured to move the at least one substrate carrier in a vertical direction between the first and second magnetic levitation tracks.

15. The transfer chamber of claim 10, further comprising a plurality of process chambers connected to the transfer chamber via a plurality of respective slit valves.

16. The transfer chamber of claim 10, wherein the transfer chamber is connected to a first load lock, wherein the first load lock is accessible to the at least one substrate carrier when engaged with the first magnetic levitation track, the transfer chamber further comprising:
a second load lock stacked above the first load lock, wherein the second load lock is accessible to the at least one substrate carrier when engaged with the second magnetic levitation track.

17. The transfer chamber of claim 14, wherein the first magnetic levitation track is configured to move the at least one substrate carrier in a first direction along the horizontal length of the transfer chamber, and wherein the second magnetic levitation track is configured to move the at least one substrate carrier in a second direction along the horizontal length of the transfer chamber, wherein the second direction is opposite the first direction.

18. A method of moving one or more substrates in a transfer chamber, comprising:
retrieving from a first process chamber a first substrate by a first substrate carrier engaged with a first magnetic levitation track disposed along a horizontal length of the transfer chamber, wherein the first magnetic levitation track is configured to generate a first magnetic field above the first magnetic levitation track;
generating the first magnetic field by the first magnetic levitation track to move the first substrate carrier with the first substrate in a first direction along the first magnetic levitation track;
rotating the first substrate carrier with the first substrate at a first junction formed where a plane of a second magnetic levitation track crosses a plane of the first magnetic levitation track, wherein the second magnetic levitation track is disposed along a horizontal width of the transfer chamber and is configured to generate a second magnetic field above or below the second magnetic levitation track;
generating the second magnetic field by the second magnetic levitation track to move the first substrate carrier with the first substrate in a second direction along the second magnetic levitation track;
rotating the first substrate carrier with the first substrate at a second junction formed where a plane of a third magnetic levitation track crosses the plane of the second magnetic levitation track, wherein the third magnetic levitation track is disposed along the horizontal length of the transfer chamber spaced apart from the first magnetic levitation track and is configured to generate a third magnetic field above the third magnetic levitation track;
generating the third magnetic field by the third magnetic levitation track to move the first substrate carrier with the first substrate in a third direction along the third magnetic levitation track to a second process chamber positioned on an opposite side of the transfer chamber from the first process chamber; and
rotating the first substrate carrier with the first substrate and placing the first substrate in the second process chamber.

19. The method of claim 18, further comprising:
rotating the first substrate carrier at a second junction formed where a third magnetic levitation track crosses the second magnetic levitation track proximate to a bottom surface of the transfer chamber, wherein the third magnetic levitation track has a face-up orientation configured to generate a third magnetic field above the third magnetic levitation track; and
generating the third magnetic field by the third magnetic levitation track to move the first substrate carrier with the first substrate in a third direction along the third magnetic levitation track.

20. The method of claim 18, further comprising:
lifting, with a first lift pin assembly, the first substrate carrier to a third magnetic levitation track positioned proximate a top surface of the transfer chamber, wherein the third magnetic levitation track has a face-down orientation and is configured to generate a third magnetic field below the third magnetic levitation track;

detecting that the first substrate carrier is proximate to the third magnetic levitation track; and generating the third magnetic field to suspend the first substrate carrier below the third magnetic levitation track and to move the first substrate carrier with the first substrate in a third direction along the third magnetic levitation track.

21. The method of claim 18, wherein at least one substrate carrier is configured to move along the first magnetic levitation track and the second magnetic levitation track, wherein the at least one substrate carrier comprises:

a passive rotational magnetic bearing configured to rotate the substrate carrier; or a mirrored drive segment configured to rotate the substrate carrier; or a stationary active bearing and drive assembly configured to rotate a turntable on a top surface of the substrate carrier; or a rotational drive configured to rotate a passive magnetic bearing; or a first magnet on a bottom surface of the substrate carrier and a second magnet on a top surface of the substrate carrier, wherein the first magnet is configured to interact with the first and second magnetic levitation tracks and the second magnet is configured to interact with third and fourth magnetic levitation tracks positioned on a top surface of the transfer chamber.

* * * * *